US011282559B1

(12) United States Patent
Tanaka et al.

(10) Patent No.: US 11,282,559 B1
(45) Date of Patent: Mar. 22, 2022

(54) MEMORY DEVICE

(71) Applicant: Kioxia Corporation, Tokyo (JP)

(72) Inventors: Reika Tanaka, Yokohama (JP);
Masumi Saitoh, Yokkaichi (JP);
Takashi Maeda, Kamakura (JP); Rieko Funatsuki, Yokohama (JP); Hidehiro Shiga, Yokohama (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/201,114

(22) Filed: Mar. 15, 2021

(30) Foreign Application Priority Data

Sep. 23, 2020 (JP) .............................. JP2020-158932

(51) Int. Cl.
*G11C 11/22* (2006.01)
*H01L 27/11597* (2017.01)

(52) U.S. Cl.
CPC ........ *G11C 11/2275* (2013.01); *G11C 11/223* (2013.01); *G11C 11/2273* (2013.01); *G11C 11/2277* (2013.01); *H01L 27/11597* (2013.01)

(58) Field of Classification Search
CPC .............. G11C 11/2275; G11C 11/223; G11C 11/2273; G11C 11/2277; H01L 27/11597
USPC .................................................. 365/145, 158
See application file for complete search history.

(56) References Cited

U.S. PATENT DOCUMENTS

| 8,953,359 | B2 | 2/2015 | Shuto et al. |
| 9,224,474 | B2 | 12/2015 | Lue |
| 9,281,044 | B2 | 3/2016 | Ramaswamy et al. |
| 10,636,468 | B2 | 4/2020 | Higashi et al. |
| 11,093,173 | B2* | 8/2021 | Yamaki ................. G06F 3/0659 |
| 2002/0028547 | A1 | 3/2002 | Ryu et al. |
| 2005/0127428 | A1* | 6/2005 | Mokhlesi ............ H01L 29/7883 257/315 |
| 2011/0019480 | A1* | 1/2011 | Kito .................. H01L 27/11578 365/185.18 |
| 2012/0147650 | A1* | 6/2012 | Samachisa ............ H01L 27/249 365/51 |
| 2014/0010016 | A1* | 1/2014 | Higuchi .............. H01L 29/7926 365/185.18 |

(Continued)

FOREIGN PATENT DOCUMENTS

| JP | 5902111 B2 | 4/2016 |
| JP | 6043021 B2 | 12/2016 |

(Continued)

*Primary Examiner* — Michael T Tran
(74) *Attorney, Agent, or Firm* — Oblon, McClelland, Maier & Neustadt, L.L.P.

(57) ABSTRACT

According to one embodiment, a memory device includes: a third layer between first and a second layers above a substrate; a pillar being adjacent to the first to third layers and including a ferroelectric layer; a memory cell between the third layer and the pillar; and a circuit which executes a first operation for a programming, a second operation for an erasing using a first voltage, and a third operation of applying a second voltage between the third layer and the pillar. The first voltage has a first potential difference, the second voltage has a second potential difference smaller than the first potential difference. A potential of the third conductive layer is lower than a potential of the pillar in each of the first and second voltages. The third operation is executed between the first operation and the second operation.

19 Claims, 26 Drawing Sheets

(56) References Cited

U.S. PATENT DOCUMENTS

| | | | | |
|---|---|---|---|---|
| 2014/0045318 | A1* | 2/2014 | Parthasarathy | H01L 29/66734 438/430 |
| 2016/0005753 | A1* | 1/2016 | Nowak | G11C 16/04 257/314 |
| 2019/0043873 | A1* | 2/2019 | Hasnat | H01L 27/11531 |
| 2019/0238134 | A1* | 8/2019 | Lee | H03K 19/1776 |
| 2019/0245543 | A1* | 8/2019 | Lee | G11C 11/412 |
| 2019/0326431 | A1* | 10/2019 | Yilmaz | H01L 29/66734 |
| 2020/0051607 | A1* | 2/2020 | Pan | H01L 27/11507 |
| 2020/0273867 | A1* | 8/2020 | Manipatruni | H01L 28/56 |
| 2021/0202507 | A1* | 7/2021 | Thareja | H01L 28/40 |
| 2021/0202703 | A1* | 7/2021 | Rajash | H01L 29/40114 |
| 2021/0335789 | A1* | 10/2021 | Zhu | G11C 11/4097 |

FOREIGN PATENT DOCUMENTS

| | | |
|---|---|---|
| JP | 6303224 B2 | 4/2018 |
| JP | 2019-160374 A | 9/2019 |

* cited by examiner

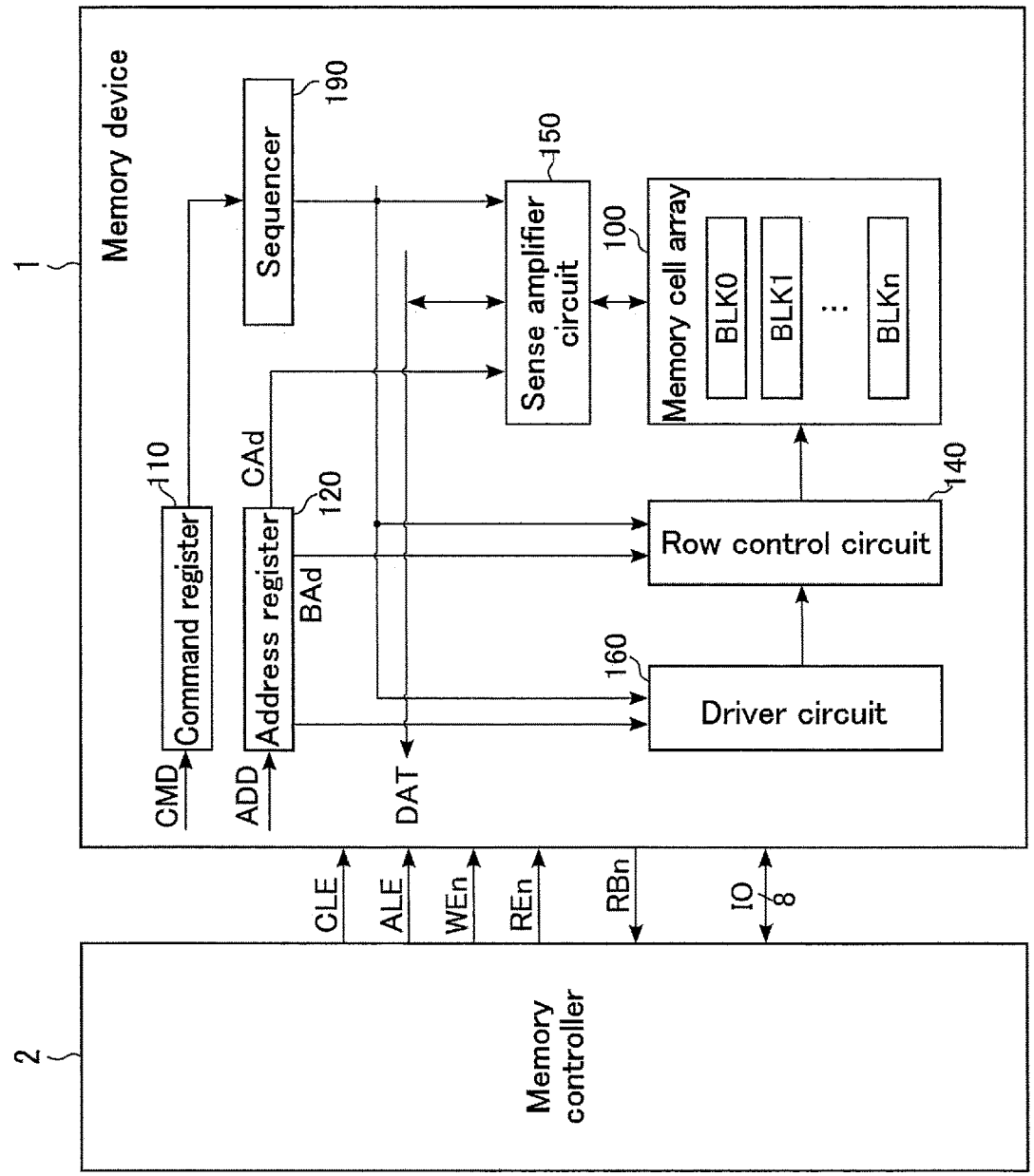
F I G. 1

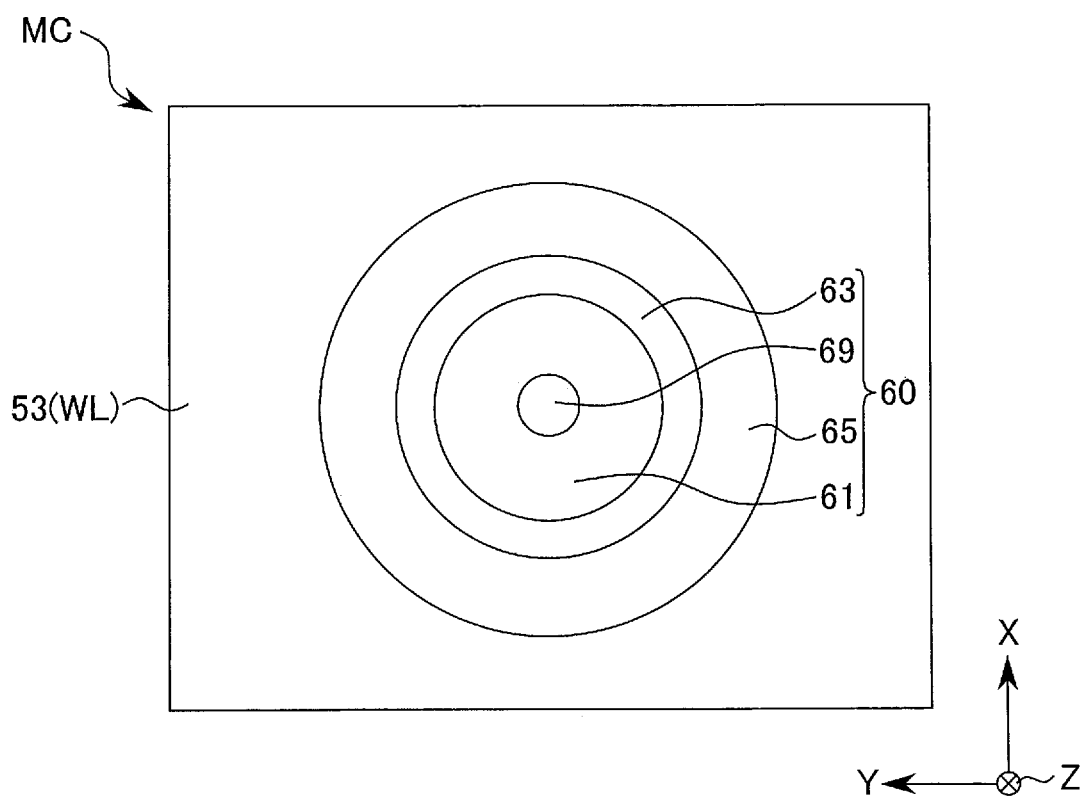
F I G. 4
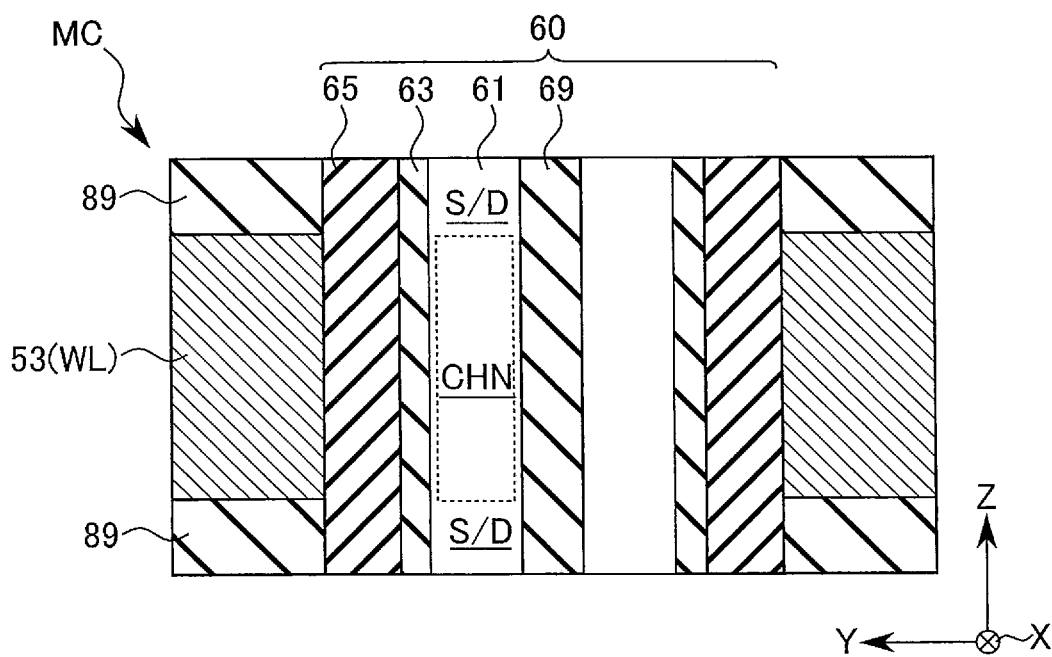
F I G. 5

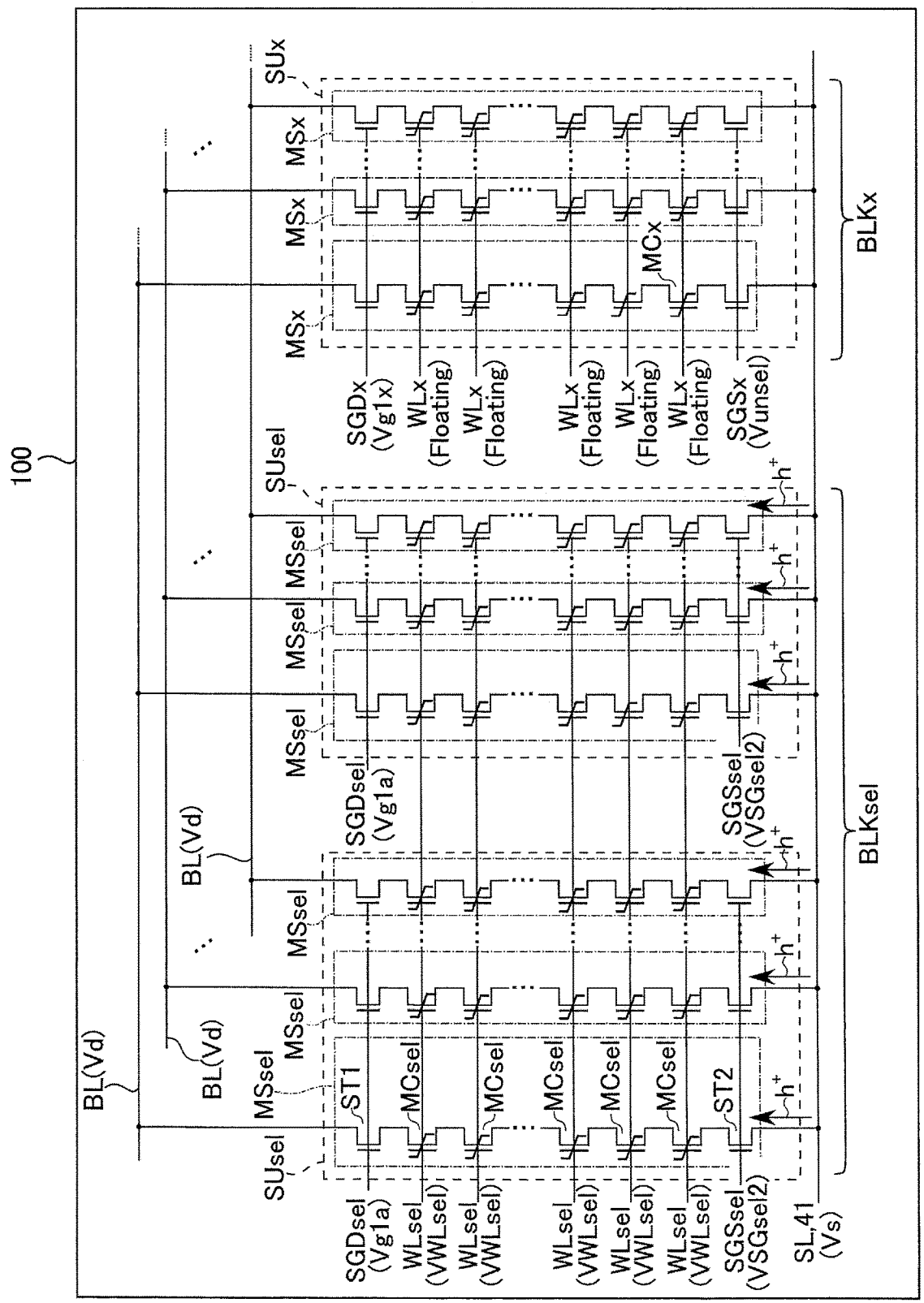
F I G. 10

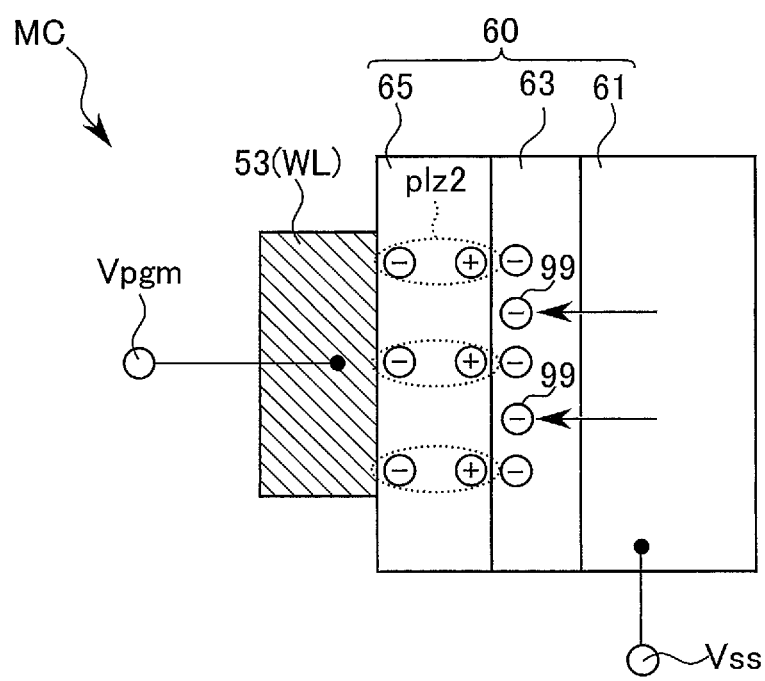
F I G. 14

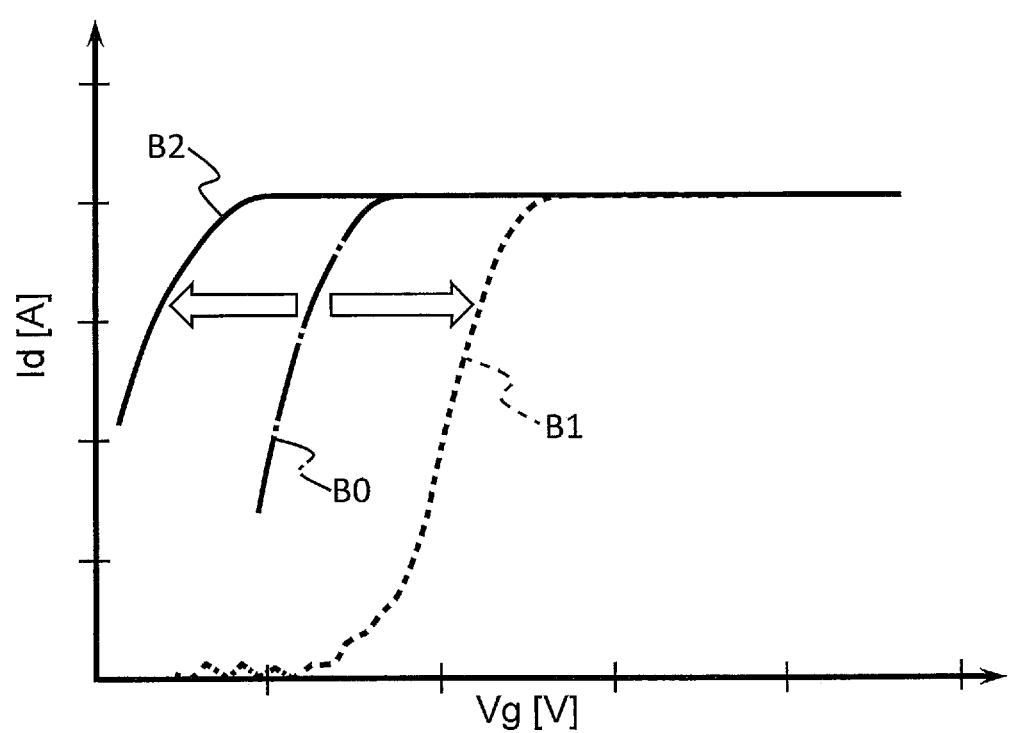
F I G. 18

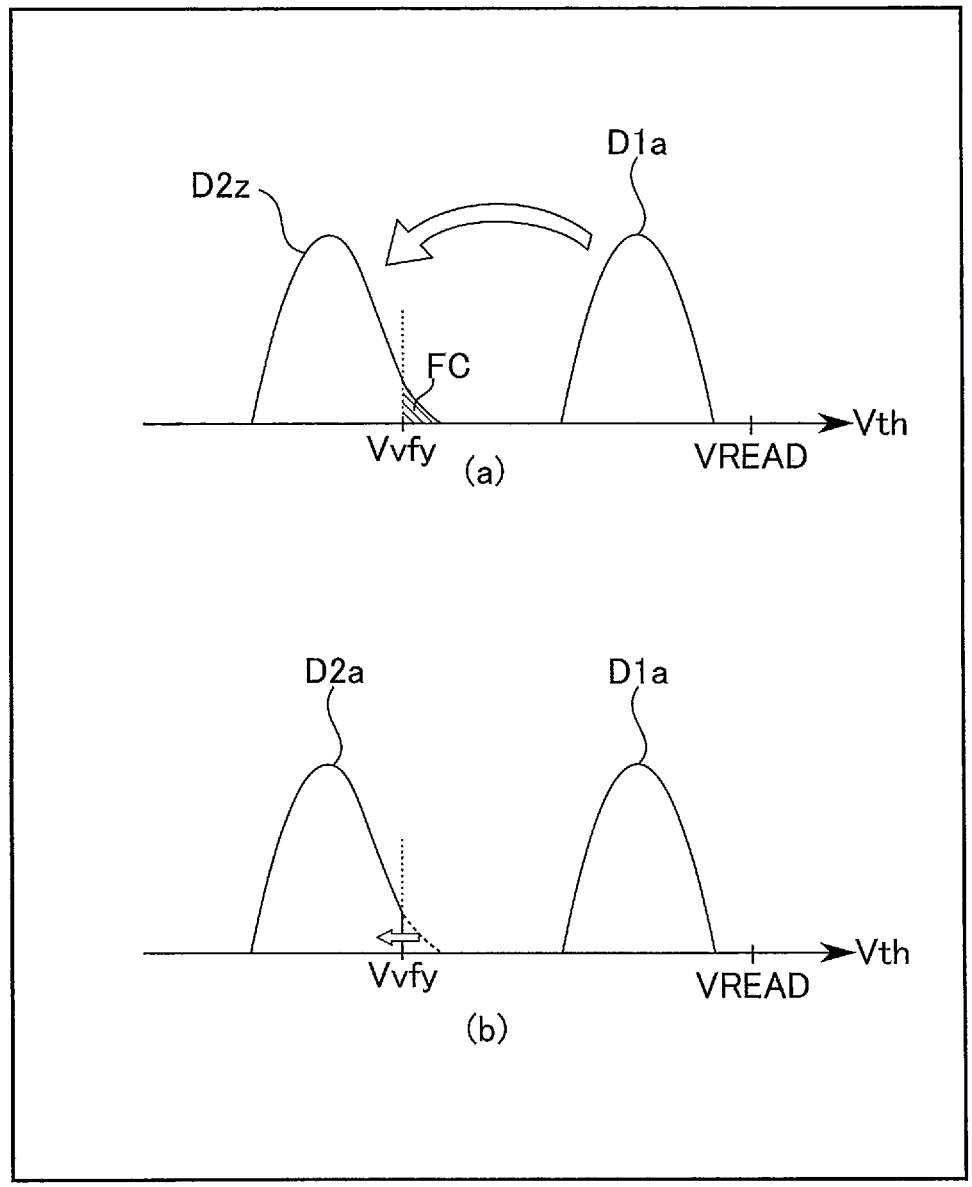
F I G. 23

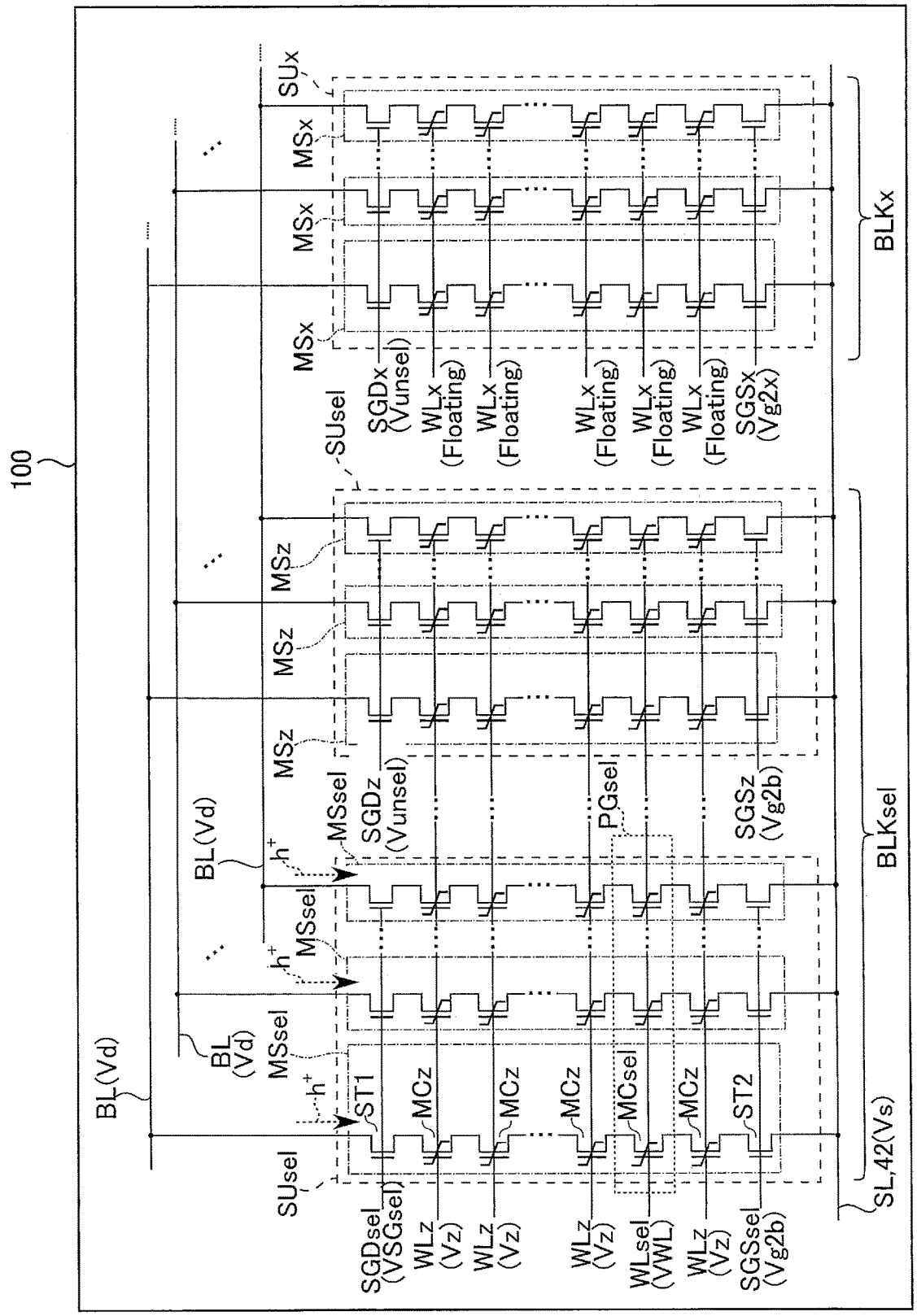
F I G. 24

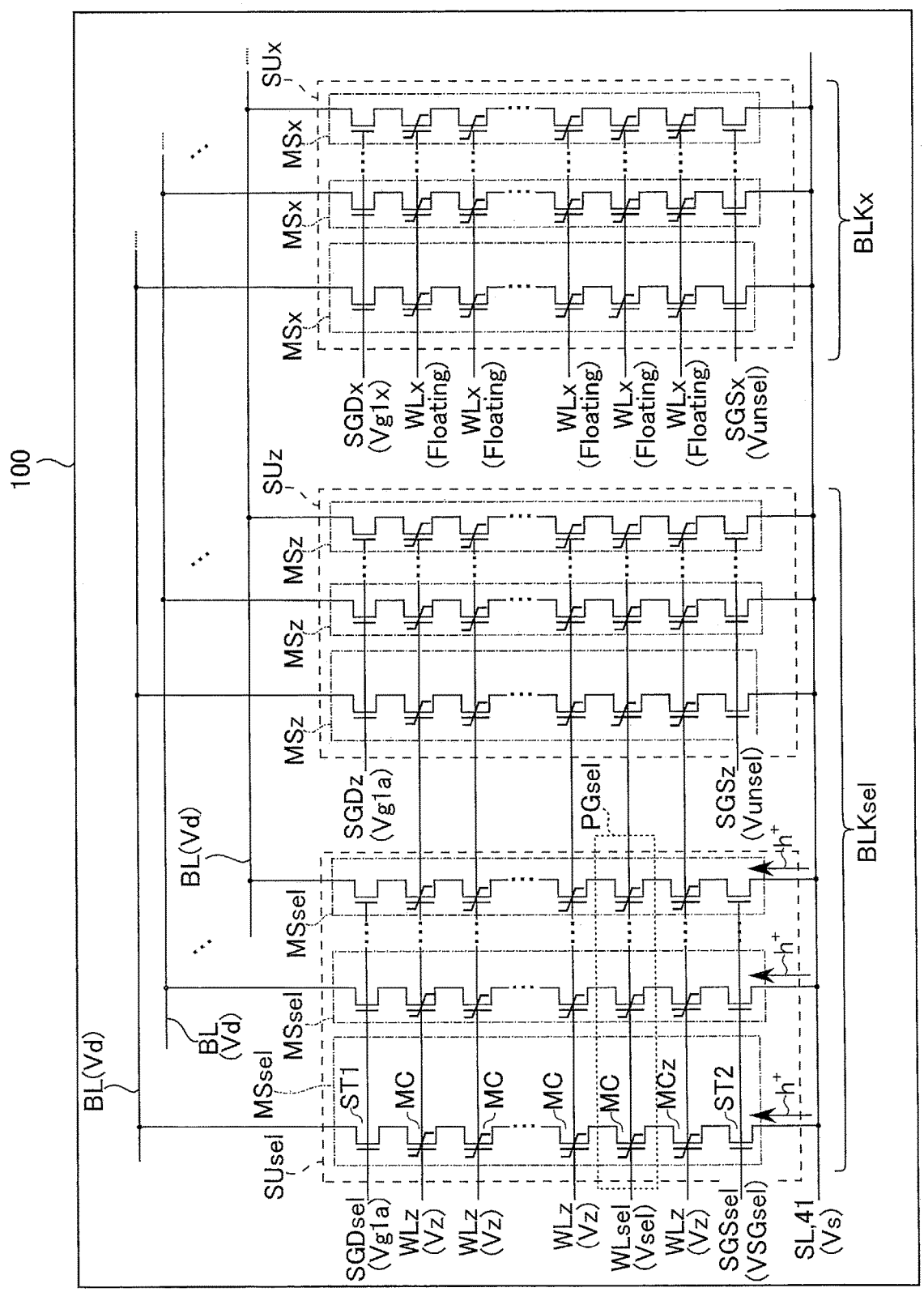
F I G. 25

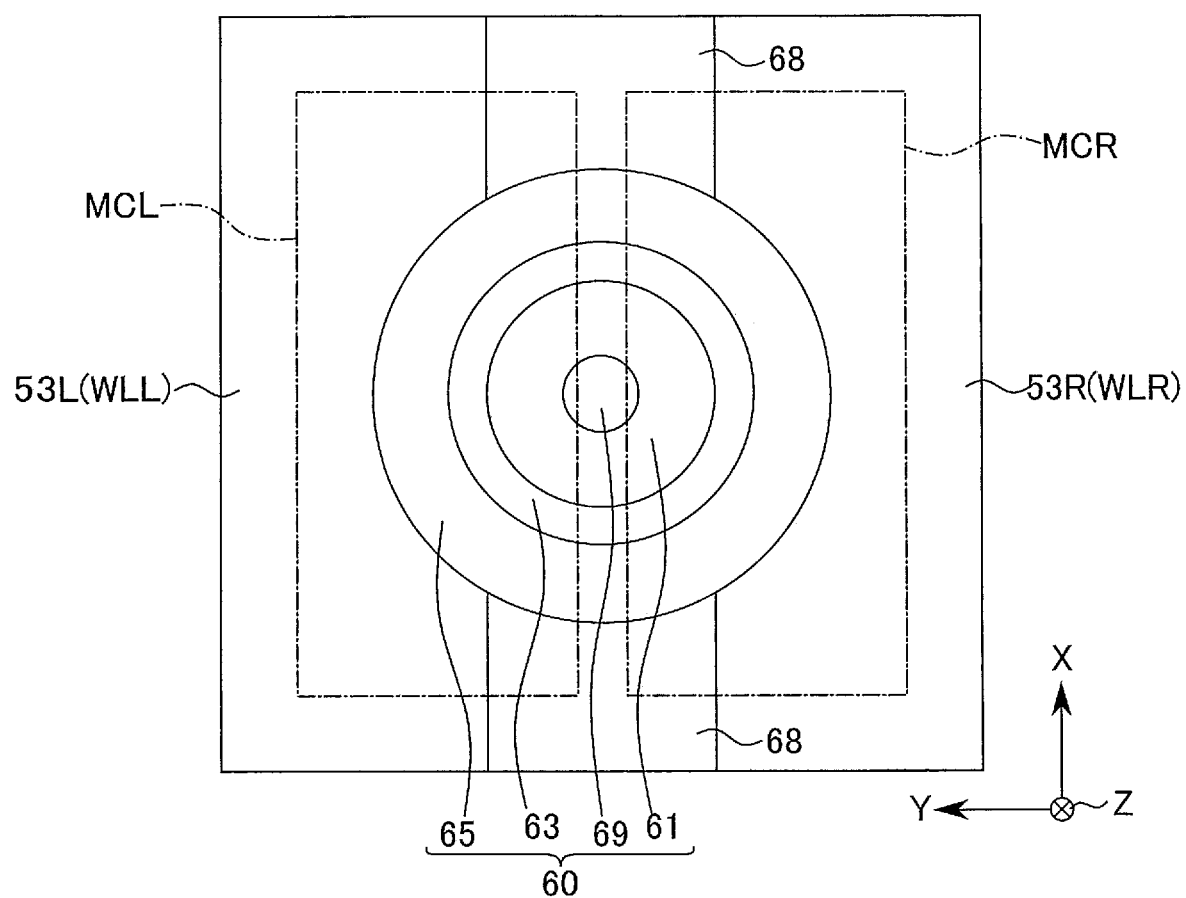
F I G. 26

MEMORY DEVICE

CROSS-REFERENCE TO RELATED APPLICATIONS

This application is based upon and claims the benefit of priority from Japanese Patent Application No. 2020-158932, filed Sep. 23, 2020, the entire contents of which are incorporated herein by reference.

FIELD

Embodiments described herein relate generally to a memory device.

BACKGROUND

There is proposed a memory device that stores data by utilizing the polarization characteristics of a ferroelectric layer.

BRIEF DESCRIPTION OF THE DRAWINGS

FIG. 1 is a block diagram showing a configuration example of a memory device of the first embodiment.

FIG. 4 is a top view of a memory cell of the memory device of the first embodiment.

FIG. 5 is a cross-sectional view of the memory cell of the memory device of the first embodiment.

FIG. 9 and FIG. 10 are diagrams showing an operation example of the memory device of the first embodiment.

FIG. 13, FIG. 14, FIG. 15 and FIG. 16 are diagrams showing an operation example of the memory device of the first embodiment.

FIG. 18 is a diagram showing characteristics of the memory device of the first embodiment.

FIG. 23 is a diagram showing an operation example of the memory device of the third embodiment.

FIG. 24, FIG. 25, FIG. 26, FIG. 27, FIG. 28 and FIG. 29 are diagrams showing modifications of a memory device of one embodiment.

DETAILED DESCRIPTION

Figure 2:
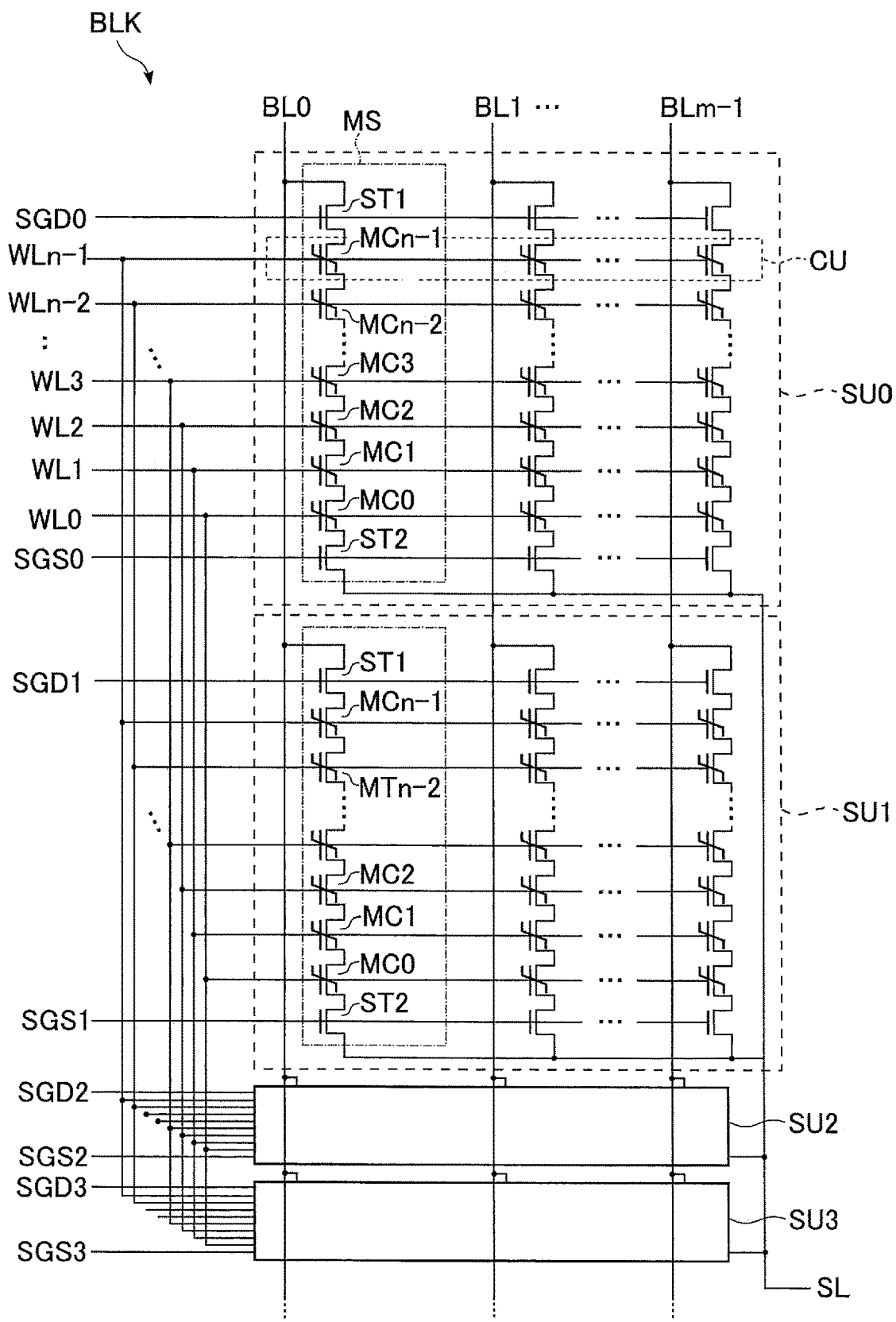
FIG. 2 is a circuit diagram of a memory cell array of the memory device of the first embodiment.

The embodiments will be described in detail with reference to the accompanying drawings. In the description below, elements having the same functions and configurations will be denoted by the same reference symbols.

In the embodiments described below, where constituent elements denoted by reference symbols to which numbers/letters are attached at the end for discrimination (e.g., circuits, interconnects, various voltages and signals) do not have to be discriminated from each other, reference symbols without the numbers/letters at the end will be used.

In general, according to one embodiment, a memory device includes: a first conductive layer provided above a substrate in a first direction perpendicular to a surface of the substrate; a second conductive layer provided between the first conductive layer and the substrate; a third conductive layer provided between the first conductive layer and the second conductive layer; a first pillar extending in the first direction, being adjacent to the first to third conductive layers in a second direction parallel to the surface of the substrate, and including a first ferroelectric layer; a first transistor provided between the first conductive layer and the first pillar; a second transistor provided between the second conductive layer and the first pillar; a first memory cell including a first ferroelectric transistor provided between the third conductive layer and the first pillar; and a circuit configured to execute a first operation of setting the first memory cell to a programmed state, a second operation of setting the first memory cell to an erased state using a first voltage, and a third operation of applying a second voltage between the third conductive layer and the first pillar, wherein the first voltage has a first potential difference between the third conductive layer and the first pillar, a potential of the third conductor layer is lower than a potential of the first pillar, the second voltage has a second potential difference between the third conductive layer and the first pillar, the second potential difference is smaller than the first potential difference, a potential of the third conductor layer is lower than a potential of the first pillar, and the circuit executes the third operation between the first operation and the second operation.

EMBODIMENTS

Memory devices of embodiments will be described with reference to FIGS. 1 to 29.

(1) First Embodiment

A configuration example and an operation example of the memory device of the first embodiment will be described with reference to FIG. 1 to FIG. 18.

(1a) Configuration Example

A configuration example of the memory device of the present embodiment will be described with reference to FIG. 1 to FIG. 8.

FIG. 1 is a block diagram illustrating a configuration example of the memory device of the present embodiment.

As shown in FIG. 1, the memory device 1 of the present embodiment is electrically coupled to a memory controller 2.

The memory controller 2 sends a command CMD, address information ADD and various control signals CNT to the memory device 1 of the present embodiment.

The memory device 1 receives the command CMD, address information ADD and various control signals CNT. Data DAT is transferred between the memory device 1 and the memory controller 2. In the description set forth below, the data DAT transferred from the memory controller 2 to the memory device 1 during a write operation will be referred to as write data. The write data DAT is written in the memory device 1. The data DAT transferred from the memory device 1 to the memory controller 2 during a read operation will be referred to as read data. The read data DAT is read from the memory device 1.

The memory device 1 of the present embodiment includes, for example, a memory cell array 100, a command register 110, an address register 120, a row control circuit 140, a sense amplifier circuit 150, a driver circuit 160 and a sequencer 190.

The memory cell array 100 stores data. Inside the memory cell array 100, a plurality of bit lines and a plurality of word lines are provided. The memory cell array 100 includes a plurality of blocks BLK0 to BLKn (n is an integer of 1 or more). The block BLK is a set of a plurality of memory cells. Each memory cell is associated with one bit line and one word line. The configuration of the memory cell array 100 will be described later.

The command register 110 holds a command CMD received from the memory controller 2. The command CMD includes, for example, an instruction for causing the sequencer 190 to execute a read operation, a write operation, an erase operation, etc.

The address register 120 holds address information ADD received from the memory controller 2. The address information ADD includes, for example, a block address BAd, a page address and a column address CAd. For example, the block address BAd, page address and column address CAd are used to select a block BLK, a word line and a bit line, respectively. In the description below, the block selected based on the block address BAd will be referred to as a selected block. The word line selected based on the page address will be referred to as a selected word line.

The row control circuit 140 controls the operation related to rows of the memory cell array 100. The row control circuit 140 selects one block BLK in the memory cell array 10, based on the block address BAd held in the address register 120. The row control circuit 140 transfers, for example, a voltage applied to the interconnect corresponding to the selected word line to a selected word line in a selected block BLK.

The sense amplifier circuit 150 controls the operation related to columns of the memory cell array 100. In a write operation, the sense amplifier circuit 150 applies a voltage to each of the bit lines BL provided in the memory cell array 100 in accordance with write data DAT received from the memory controller 2. In a read operation, the sense amplifier circuit 150 determines data stored in a memory cell MC, based on the potential (electric potential) of the bit line BL (or whether or not a current is generated). The sense amplifier circuit 150 transfers data based on this determination result to the memory controller 2 as read data.

The driver circuit 160 outputs voltages used in the read operation, write operation, erase operation, etc. to the memory cell array 100. The driver circuit 160 applies a predetermined voltage to the interconnect corresponding to, for example, a word line and a bit line, based on the address held in the address register 120.

The sequencer 190 controls the overall operation of the memory device 1. For example, the sequencer 190 controls each circuit, based on the command CMD held in the command register 110.

For example, communications between the memory device 1 and the memory controller 2 are supported by the NAND interface standard. In this case, a command latch enable signal CLE, an address latch enable signal ALE, a write enable signal WEn, a read enable signal REn, a ready/busy signal RBn and an input/output signal IO are used in the communications between the memory device 1 and the memory controller 2.

The command latch enable signal CLE is a signal indicating that the input/output signal IO received by the memory device 1 is a command CMD. The address latch enable signal ALE is a signal indicating that the signal IO received by the memory device 1 is address information ADD. The write enable signal WEn is a signal that instructs the memory device 1 to input the input/output signal TO. The read enable signal REn is a signal that instructs the memory device 1 to output the input/output signal IO.

The ready/busy signal RBn is a signal that notifies the memory controller 2 whether the memory device 1 is in a ready state in which an instruction from the memory controller 2 is received or in a busy state in which the instruction is not received. The input/output signal IO is, for example, an 8-bit signal and may include a command CMD, address information ADD, data DAT, etc.

The memory device 1 may further include an input/output circuit (not shown), a voltage generation circuit (not shown), etc. The input/output circuit functions as a memory-device-side interface circuit between the memory device 1 and the memory controller 2. The voltage generation circuit generates a plurality of voltages for respective operations of the memory device 1.

<Memory Cell Array>

FIG. 2 is a circuit diagram showing a configuration example of the memory cell array of the memory device of the present embodiment.

In FIG. 2, one block BLK of the plurality of blocks BLK included in the memory cell array 100 is extracted and shown.

As shown in FIG. 2, the block BLK includes, for example, four string units SU0, SU1, SU2 and SU3. Each string unit SU includes a plurality of memory cell strings MS. Each of the plurality of memory cell strings MS is coupled to the corresponding one of the plurality of bit lines BL0, BL1, . . . BLm-1 (m is an integer of 1 or more).

Each memory cell string MS includes a plurality of memory cells MC0, MC1, MCn-1 (n is an integer of 1 or more), and select transistors ST1 and ST2.

For example, n memory cells MC (MC0, MC1, MC2, MC3, . . . , MCn-2, MCn-1) are provided in each memory cell string MS.

Each memory cell MC can store one or more bits of data substantially in a non-volatile manner.

Each of the select transistors ST1 and ST2 is used to select a string unit SU during various operations. For example, each select transistor ST1 may include one or more transistors. Likewise, each select transistor ST2 may include one or more transistors.

In each memory cell string MS, a plurality of memory cell MCs are coupled in series between the source of the select transistor ST1 and the drain of the select transistor ST2. The gates of the memory cells MC0, MC1, MC2, MC3, MCn-2, MCn-1 in the same block BLK are coupled to the corresponding one of the plurality of word lines WL0, WL1, WL2, WL3, WLn-2, WLn-1.

In each memory cell string MS, one terminal (the drain in this case) of the select transistor ST1 is coupled to the corresponding one of the plurality of bit lines BL0, BL1, BLm-1.

The Other terminal (the source in this case) of the select transistor ST1 is coupled to one end of the memory cells MC0, MCn-1 coupled in series.

Each of the gates of the select transistor ST1 is coupled to the corresponding one of the plurality of select gate lines SGD.

The gates of the select transistors ST1 in the string unit SU0 are coupled to the select gate line SGD0. The gates of the select transistors ST1 in the string unit SU1 are coupled to the select gate line SGD1. The gates of the select transistors ST1 in the string unit SU2 are coupled to the select gate line SGD2. The gates of the select transistors ST1 in the string unit SU3 are coupled to the select gate line SGD3.

One terminal (the drain in this case) of the select transistor ST2 is coupled to the other end of the memory cells MC0, MCn-1 coupled in series. The other terminal (the source in this case) of the select transistor ST2 is coupled to the source line SL. The sources of the plurality of select transistors ST2 in the same block BLK are commonly coupled to the source line SL.

Each of the gates of the select transistors ST2 is coupled to the corresponding one of the plurality of the select gate line SGS.

The gates of the select transistors ST2 in the string unit SU0 are coupled to the select gate line SGS0. The gates of the select transistors ST2 in the string unit SU1 are coupled to the select gate line SGS1. The gates of the select transistors ST2 in the string unit SU2 are coupled to the select gate line SGS2. The gates of the select transistors ST2 in the string unit SU3 are coupled to the select gate line SGS3.

In the circuit configuration of the memory cell array 100 described above, the drains of the select transistors ST1 corresponding to the same column of the plurality of blocks BLK are coupled to the same bit line BL. The source lines SL are, for example, commonly coupled between a plurality of blocks BLK.

The drains of the select transistors ST1 corresponding to the same column of the plurality of string units SU are coupled to the same bit line BL.

A plurality of memory cell MCs coupled to the common word line WL in one string unit SU are referred to as a cell unit CU, for example.

For example, when each of the memory cells MC stores 1-bit data, one cell unit CU can store one page of data. When each of the memory cells MC stores 2-bit data, one cell unit CU can store 2 pages of data.

In the present embodiment, the memory cell MC is a ferroelectric field effect transistor (FeFET). The threshold voltage of the ferroelectric transistor changes depending upon the direction of spontaneous polarization of the ferroelectric layer of the ferroelectric transistor.

The memory device 1 of the present embodiment stores data by associating data with the change of the threshold voltage of the ferroelectric transistor MC depending upon the direction of spontaneous polarization.

In the description below, the memory device of the present embodiment will be referred to as a ferroelectric memory.

Figure 3:
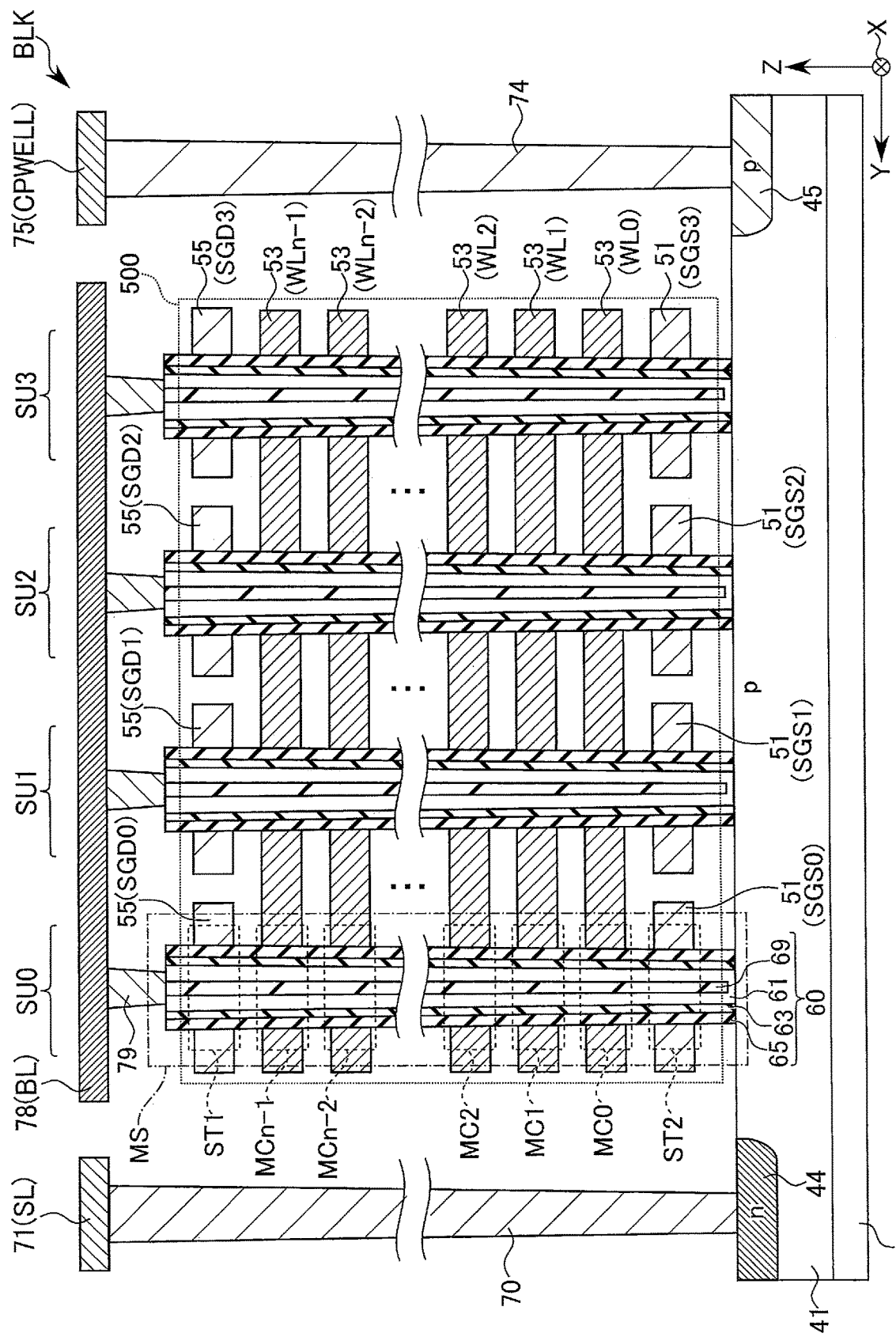
FIG. 3 is a cross-sectional view of the memory cell array of the memory device of the first embodiment.

FIG. 3 is a cross-sectional view showing a configuration example of the memory cell array of the ferroelectric memory of the present embodiment.

In FIG. 3, insulating layers (interlayer insulating films) covering the upper surface of the substrate are not shown for clarity of illustration.

As shown in FIG. 3, the memory cells MC are arranged two-dimensionally above the upper surface (X-Y plane) of the substrate 40. The memory cells MC are arranged in a direction (Z direction) perpendicular to the upper surface of the substrate 40.

As can be seen from this, in the present embodiment, the ferroelectric memory 1 includes a memory cell array having a three-dimensional configuration.

For example, the substrate 40 is a semiconductor substrate (e.g., a silicon substrate).

The substrate 40 includes a semiconductor layer 41. The semiconductor layer 41 includes a dopant (impurities) according to the conductivity type to be imparted. For example, the semiconductor layer 41 is a p-type semiconductor layer. The semiconductor layer includes a predetermined concentration of p-type dopant (e.g., boron).

The semiconductor layer 41 is, for example, a well region provided in the semiconductor substrate 40.

A plurality of semiconductor regions 44 and 45 are provided in the semiconductor layer 41. Each of the semiconductor regions 44 and 45 includes an n-type or p-type dopant (impurities) depending upon the conductivity type to be imparted.

For example, the semiconductor region 44 is an n-type semiconductor region (diffusion layer). The n-type semiconductor region 44 includes an n-type dopant (e.g., phosphorus or arsenic) having a predetermined concentration.

The semiconductor region 44 is coupled to an interconnect (e.g., a metal layer) 71 via a contact plug 70.

The contact plug 70 is provided on the semiconductor region 44. The contact plug 70 extends in the Z direction. The interconnect 71 is provided above the semiconductor layer 41 in the Z direction. The interconnect 71 functions as a source line SL.

For example, the semiconductor region 45 is a p-type semiconductor region (diffusion layer). The p-type semiconductor region includes a p-type dopant having a predetermined concentration.

The semiconductor region 45 is coupled to an interconnect (e.g., a metal layer) 75 via a contact plug 74. The contact plug 74 is provided on the semiconductor region 45. The contact plug 74 extends in the Z direction. The interconnect 75 is provided above the semiconductor layer 41 in the Z direction. The interconnect 75 functions as a well interconnect CPWELL. The potential (electric potential) of the semiconductor layer 41 can be controlled by applying a voltage to the semiconductor layer 41 via the interconnect 75.

A plurality of conductive layers 51, 53 and 55 are stacked above the semiconductor layer 41 in the Z direction. Insulating layers (not shown) are provided between the conductive layers 51, 53, and 55 that are adjacent in the Z direction.

The plurality of conductive layers 51 are arranged in the Y direction above the substrate 40 in the Z direction. Each conductive layer 51 extends in the X direction. Each conductive layer 51 functions as a source-side select gate line SGS (SGS0, SGS1, SGS2, and SGS3). Each conductive layer 51 is separate from the other conductive layers 51, for each string unit SU (SU0, SU1, SU2 and SU3).

The plurality of conductive layers 55 are arranged in the Y direction above the conductive layer 53 in the Z direction. Each conductive layer 55 extends in the X direction. Each conductive layer 55 functions as a drain-side select gate line SGD (SGD0, SGD1, SGD2 and SGD3). Each conductive layer 55 is separate from the other conductive layers 51, for each string unit SU (SU0, SU1, SU2 and SU3).

The plurality of conductive layers 53 are stacked above the substrate 40 in the Z direction. The plurality of conductive layers 53 are arranged in the Z direction in the space that is between the conductive layers 51 and the conductive layers 55 in the Z direction. Each conductive layer 53 has, for example, a plate-like structure extending in the X-Y plane. Each conductive layer 53 functions as a word line WL. Each conductive layer 53 spans a plurality of string units SU in the block BLK.

A plurality of pillars 60 are provided in a layer stack 500 including the conductive layers 51, 53 and 55 (and the insulating layers (not shown)). Each pillar 60 extends in the Z direction. The pillar 60 penetrates the plurality of conductive layers 51, 53 and 55. The side face (the plane along the Z direction) of the pillar 60 is opposed to the conductive layers 51, 53 and 55.

The lower end (bottom portion) of the pillar 60 in the Z direction is in contact with the semiconductor layer 41. The upper end (top portion) of the pillar 60 in the Z direction is coupled to an interconnect (e.g., a metal layer) 78 via a contact plug 79. The interconnect 78 extends in the Y direction. The interconnect 78 functions as a bit line BL. For example, the plurality of pillars 60 arranged in the Y direction are commonly coupled to one interconnect (bit line) 78.

The pillar 60 includes a semiconductor layer 61, an insulating layer 63, a ferroelectric layer 65 and a core layer 69. In the present embodiment, the pillar 60 including the ferroelectric layer 65 is referred to as a memory pillar.

The core layer 69 has a columnar structure extending along the Z direction. For example, the upper end of the core layer 69 is arranged in the area between the region where the interconnect 78 of the uppermost layer is provided and the region where the conductive layer 55 is provided. The lower end of the core layer 69 is in contact with the semiconductor layer 61. The core layer 69 includes an insulator such as silicon dioxide (S102).

The semiconductor layer 61 is provided between the core layer 69 and the insulating layer 63, and between the core layer 69 and the semiconductor layer 41. The lower end of the semiconductor layer 61 is located between the lower end of the core layer 69 and the upper surface of the semiconductor layer 41. The semiconductor layer 61 has a portion that is in direct contact with the semiconductor layer 41. Thus, the semiconductor layer 61 is electrically coupled to the semiconductor layer 41. For example, the semiconductor layer 61 covers the core layer 69. The semiconductor layer 61 has a cylindrical (or elliptical tubular) structure. The semiconductor layer 61 is, for example, a layer including silicon (e.g., a polysilicon layer or an amorphous silicon layer).

The insulating layer 63 is provided between the ferroelectric layer 65 and the semiconductor layer 61. The insulating layer 63 covers the side face (the face extending along the Z direction) of the semiconductor layer 61. The insulating layer 63 is, for example, a layer including silicon oxide.

The ferroelectric layer 65 is provided between the conductive layers 51, 53, 55 and the insulating layer 63. The side face (the face extending along the Z direction) of the ferroelectric layer 65 is opposed to the conductive layers 51, 53 and 55.

The ferroelectric layer 65 is, for example, a layer including hafnium oxide. A hafnium oxide layer to which at least one kind of silicon, aluminum, barium, zirconium, gadolinium, lanthanum, strontium and yttrium is added is used as the ferroelectric layer 65.

The ferroelectric layer 65 has a spontaneous polarization property.

The portion including the ferroelectric layer at the intersection between the conductive layer 53 and the memory pillar 60 functions as a memory cell (ferroelectric transistor) MC.

FIG. 4 and FIG. 5 are diagrams for illustrating a configuration example of a memory cell of the memory device of the present embodiment. FIG. 4 is a top view for illustrating a planar configuration of the memory cell of the present embodiment. FIG. 5 is a cross-sectional view for illustrating a cross-sectional configuration of the memory cell of the present embodiment.

As shown in FIG. 4, the memory pillar 60 has a cylindrical structure.

The core layer 69 has a columnar (or elliptical columnar) structure extending in the Z direction.

The semiconductor layer 61 has a cylindrical (or elliptical cylindrical) structure extending in the Z direction.

The insulating layer 63 is provided between ferroelectric layer 65 and the semiconductor layer 61. The insulating layer 63 has a cylindrical structure. The cylindrical (or elliptical cylindrical) insulating layer 63 covers the side face (the face extending along the Z direction) of the semiconductor layer 61.

The ferroelectric layer 65 is provided between the conductive layer 53 and the insulating layer 63. The ferroelectric layer 65 has a cylindrical (or elliptical cylindrical) structure. The cylindrical ferroelectric layer 65 covers the side face of the semiconductor layer 61, with the insulating layer 63 interposed.

As described above, the memory cell MC is a ferroelectric transistor in the present embodiment.

The layer stack including the insulating layer 63 and the ferroelectric layer 65 functions as a gate insulating film of the ferroelectric transistor MC. It should be noted that only the insulating layer 63 may be used as the gate insulating film, in which case the ferroelectric layer 65 is used as a memory layer. The insulating layer 63 may be a layer stack including a plurality of layers of different materials, or may be a single-layer film made of a certain material.

The conductive layer 53 is a word line WL of the ferroelectric memory 1, and also functions as a gate electrode of the ferroelectric transistor MC. The conductive layer 53 is provided between the insulating layers 89 in the Z direction.

The conductive layer 53 is, for example, a layer stack including a metal layer (e.g., a tungsten layer) and a conductive compound layer (e.g., a titanium nitride layer). In this case, the conductive compound layer (not shown) is provided between the metal layer (not shown) and the insulating layer 89 and between the metal layer and the ferroelectric layer 65.

The channel region CHN of the ferroelectric transistor MC is provided inside the semiconductor layer 61. The channel region CHN of the ferroelectric transistor MC faces the conductive layer 53, with the ferroelectric layer 65 and the insulating layer 63 interposed. The two source/drain regions S/D of the ferroelectric transistor MC are aligned in the Z direction inside the semiconductor layer 61, with the channel region CHN interposed.

As described above, the ferroelectric transistor MC is a vertical transistor. Therefore, the current path of the ferroelectric transistor MC used as a memory cell is along the Z direction.

The select transistors ST (ST1 and ST2) have substantially the same configuration as the ferroelectric transistor MC. It should be noted that the configuration of the select transistors ST may be different from that of the ferroelectric transistor MC. For example, the select transistors ST may have a configuration that does not include a ferroelectric layer (memory layer).

The memory cell array having the configuration shown in FIG. 3 is formed by a known manufacturing method.

In the memory device of the present embodiment, the ferroelectric transistor is used as a memory cell MC by utilization of the polarization characteristics thereof.

<Operating Principle Of Memory Cell>

The operating principle of the ferroelectric transistor used as a memory cell will be described with reference to FIGS. 6 to 8.

Figure 6:
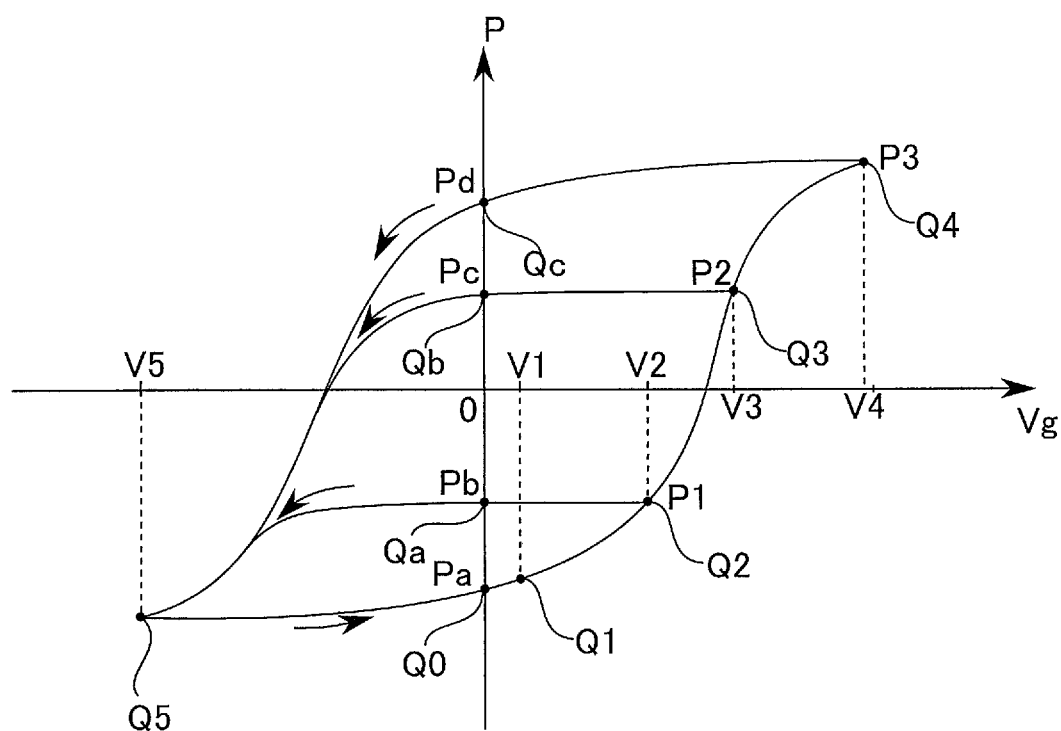
FIG. 6, FIG. 7 and FIG. 8 are diagrams showing characteristics of the memory device of the first embodiment.
Figure 7:
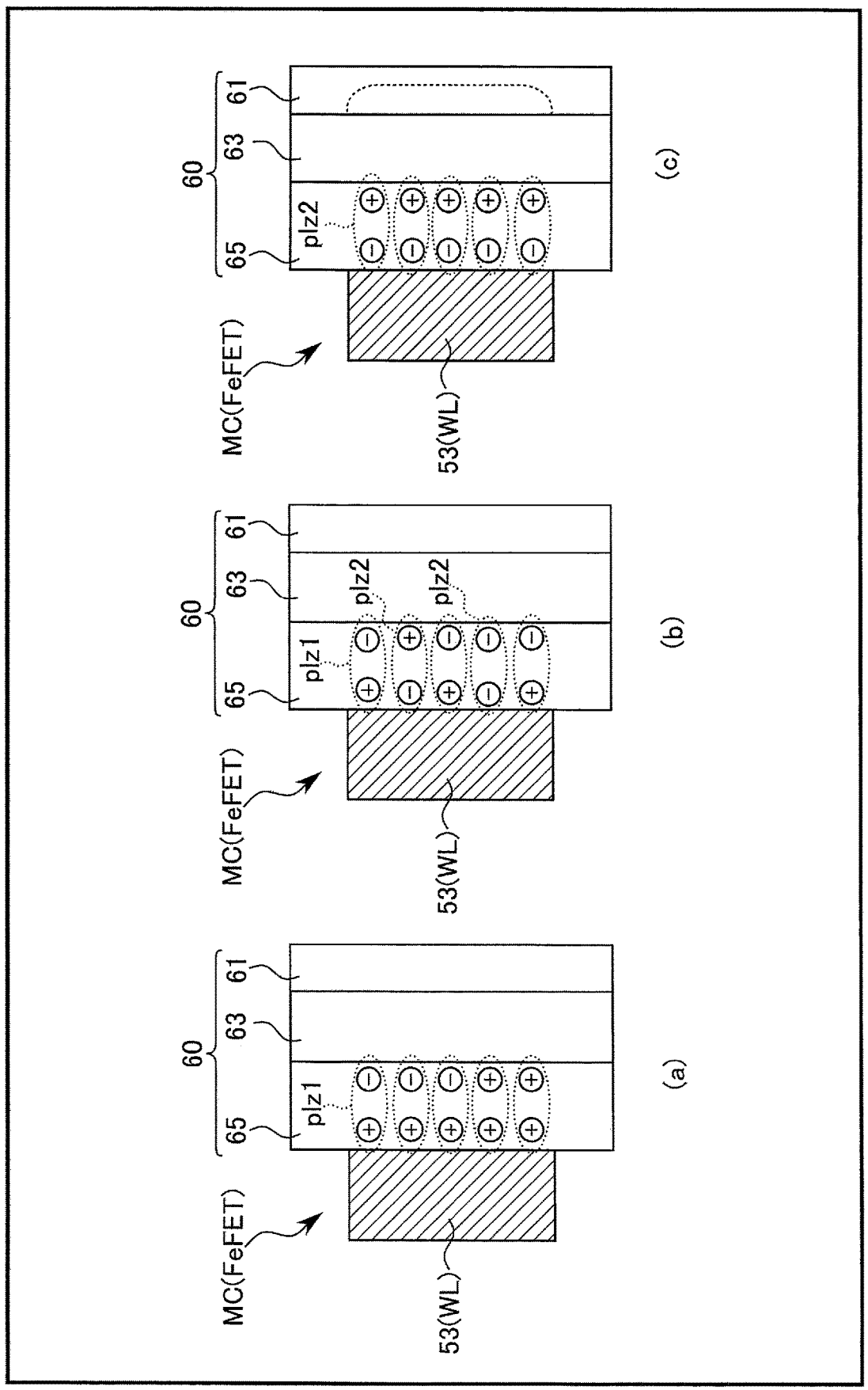

FIGS. 6 and 7 are schematic diagrams for illustrating characteristics of the ferroelectric transistor used as a memory cell.

FIG. 6 is a graph showing the polarization characteristics of the ferroelectric transistor. The horizontal axis of the graph of FIG. 6 indicates a gate-source voltage Vg of a memory cell, and the vertical axis of the graph of FIG. 6 indicates spontaneous polarization rate P of the ferroelectric layer of the ferroelectric transistor.

FIG. 7 is a diagram schematically illustrating the state of the ferroelectric transistor is in accordance with the state of spontaneous polarization of the ferroelectric layer.

As shown in FIG. 6, the ferroelectric layer 65 has the characteristics indicated by the hysteresis curves in the relationship between a voltage Vg and the spontaneous polarization rate. P.

When the voltage Vg is applied to the gate (word line) of the ferroelectric transistor, an electric field is generated in the ferroelectric layer 65. Due to the influence of the generated electric field, the ions arranged in the crystal lattice of the ferroelectric layer 65 change in position. As a result, polarization is generated in the ferroelectric layer 65.

The spontaneous polarization rate (also referred to as the amount of polarization) indicates a degree of spontaneous polarization of the ferroelectric layer. The spontaneous polarization rate is an amount of surface charge which is generated in the ferroelectric layer 65 per unit area in the boundary region between the ferroelectric layer 65 and another layer in contact therewith (i.e., the insulating layer 63 in the present embodiment), and which is due to the spontaneous polarization.

For example, when the voltage Vg is 0V and the spontaneous polarization rate of the ferroelectric layer 65 is a negative value Pa (the state indicated by "Q0" in FIG. 6), positive spontaneous polarization charges in spontaneous polarization plz1 are generated on the conductive layer (gate) 53 side, and negative spontaneous polarization charges are generated on the semiconductor layer (channel region) 61 side, as shown in (a) of FIG. 7.

When the voltage Vg applied to the ferroelectric transistor MC is increased from 0V to a certain positive voltage value "V1" (the state indicated by "Q1" in FIG. 6) in the state where the ferroelectric layer has a negative spontaneous polarization rate, the spontaneous polarization of the ferroelectric layer 65 is hardly reversed. In this case, the magnitude of the spontaneous polarization rate P of the ferroelectric layer hardly changes.

When the voltage value of the voltage Vg is increased from V1 to a positive voltage value "V2" (state indicated by "Q2" in FIG. 6), the direction of the spontaneous polarization plz2 of the ferroelectric layer 65 is partially reversed with respect to negative spontaneous polarization (hereinafter referred to as a negative spontaneous polarization state as well) plz1, as shown in (b) of FIG. 7. As a result, the spontaneous polarization rate P of the ferroelectric layer 65 sharply increases to a certain value P1.

Once the direction of the spontaneous polarization is reversed, this state is maintained even if the voltage value of the voltage Vg is returned from V2 to 0V. Therefore, even if the voltage Vg is lowered from the voltage value V2 to 0V in the state Q2, the spontaneous polarization rate P takes a value Pb higher than the value Pa, as indicated by the state Qa.

When the voltage value of the voltage Vg is increased from V2 to a positive voltage value "V3" (the state indicated by "Q3" in FIG. 6), the reversal of the spontaneous polarization of the ferroelectric layer 65 proceeds, and the spontaneous polarization rate P increases from the negative value P1 to the positive value P2.

As described above, the reversed state of spontaneous polarization is maintained. Therefore, when the voltage value of the voltage Vg is lowered from V3 in the state Q3 to 0V (the state indicated by "Qb" in FIG. 6), the spontaneous polarization rate P takes a value Pc higher than the value Pb.

When the voltage value of the voltage Vg is increased from V3 to a positive voltage value V4 (the state indicated by "Q4" in FIG. 6), the direction of the spontaneous polarization plz2 of the ferroelectric layer 65 is reversed entirely, as shown in (c) of FIG. 7. In this case, the spontaneous polarization rate P increases to a positive value P3, and has a saturation state, for example.

When the voltage value of the voltage Vg is lowered from V4 to 0V, the ferroelectric layer 65 has a spontaneous polarization rate of positive value Pb even if the voltage Vg is 0V, and therefore maintains a state Qc in which the spontaneous polarization rate is positive.

As described above, when the voltage Vg having a positive voltage value is applied to the ferroelectric layer 65 having a negative spontaneous polarization rate, the spontaneous polarization rate of the ferroelectric layer 65 changes from a negative value to a positive value.

When the ferroelectric layer 65 has a positive spontaneous polarization rate, a positive voltage having a magnitude corresponding to the positive spontaneous polarization rate is kept applied across the gate (conductive layer 53) and the channel region (semiconductor layer 61) of the ferroelectric transistor MC.

As a result, when the ferroelectric layer has a positive spontaneous polarization rate, the value of the threshold voltage of the ferroelectric transistor decreases, as compared with the value of the threshold voltage of the ferroelectric transistor when the ferroelectric layer has a negative spontaneous polarization rate.

When the voltage value of the voltage Vg is decreased from 0V to a negative voltage value "V5" (the state indicated by "Q5" in FIG. 6), the direction of the spontaneous polarization of the ferroelectric layer 65 is reversed from the positive polarization direction to the negative polarization direction.

As a result, the spontaneous polarization rate of the ferroelectric layer 65 of the ferroelectric transistor MC changes from a positive value to a negative value. At this time, the spontaneous polarization rate of the ferroelectric layer 65 is saturated at a negative value.

As described above, the spontaneous polarization rate of the ferroelectric layer 65 returns from the positive value to the negative value by applying a voltage Vg having a negative polarity to the ferroelectric transistor MC. When the voltage value of the voltage Vg is increased from V5 to 0V after the spontaneous polarization rate of the ferroelectric layer 65 changes from the positive value to the negative value, the spontaneous polarization rate of the ferroelectric layer 65 maintains a negative value (e.g., polarization rate Pa).

As described above, the threshold voltage of the ferroelectric transistor MC is changed in accordance with a change in the spontaneous polarization rate of the ferroelectric layer 65. The magnitude of the changed threshold voltage is maintained until the application of a voltage having a voltage value that changes the direction of the spontaneous polarization of the ferroelectric layer 65.

When the ferroelectric transistor is used as a memory cell MC, a plurality of threshold voltages of the ferroelectric transistor, which change according to the spontaneous polarization rate, can be associated with data to be stored.

Therefore, the ferroelectric transistor is applicable to a memory device used as a memory cell MC that stores data in a non-volatile manner.

<Relationships Between Threshold Voltage and Data>

Figure 8:
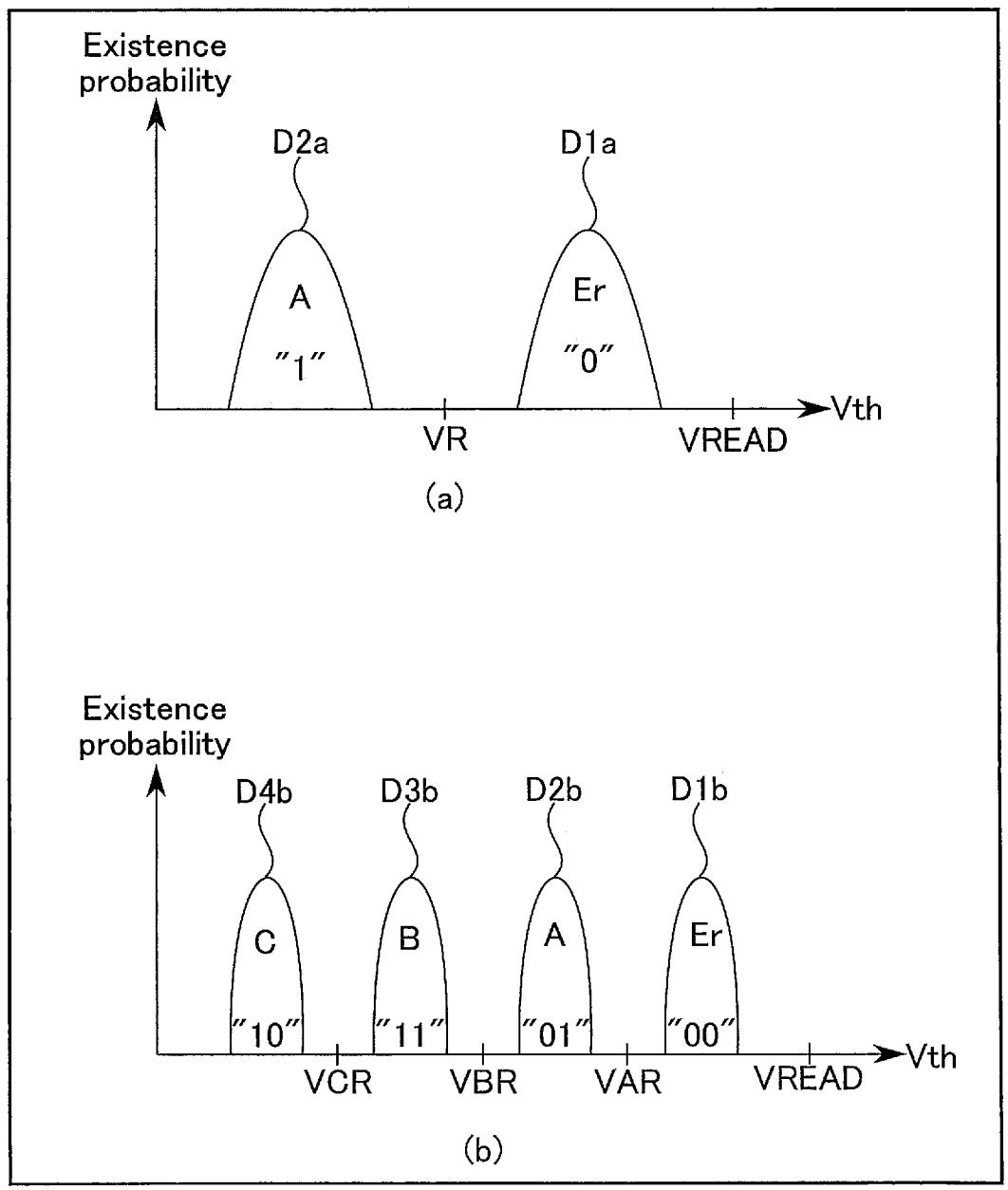

FIG. 8 is a diagram for illustrating the relationships between the threshold voltage of the ferroelectric transistor used as a memory cell and data. In each of (a) and (b) of FIG. 8, the horizontal axis of the graph corresponds to a threshold voltage of the memory cell (ferroelectric transistor), and the vertical axis of the graph corresponds to an existence probability of the memory cell.

In (a) of FIG. 8, the graph shows a relationship of "0" data and "1" data to the threshold voltage of the ferroelectric transistor when the ferroelectric transistor used as a memory cell stores 1-bit data. A memory cell that stores 1-bit data is called an SLC (single level cell).

In the case of (a) of FIG. 8, for example, the state (data holding state) of the ferroelectric transistor MC whose threshold voltage is higher than a certain voltage level VR is called an erased state (Er state). The state of the ferroelectric transistor MC whose threshold voltage is lower than the certain voltage level VR is called a programmed state (A state).

For example, the erased state of the ferroelectric transistor MC corresponds to a state in which the spontaneous polarization rate of the ferroelectric layer 65 of the ferroelectric transistor MC has a negative value (e.g., the state indicated by "Q0" in FIG. 6). The programmed state of the ferroelectric transistor MC corresponds to a state in which the spontaneous polarization rate of the ferroelectric layer 65 of the ferroelectric transistor MC has a positive value (e.g., the state indicated by Qc" in FIG. 6).

In this case, for example, the threshold voltage distribution D1a of the Er state corresponds to a set of ferroelectric transistors MC that include a ferroelectric layer having the spontaneous polarization rate Pa shown in FIG. 6. The threshold voltage distribution D2a of the A state corresponds to a set of ferroelectric transistors MC that include a ferroelectric layer having the spontaneous polarization rate Pd shown in FIG. 6.

For example, "0" data is associated with an erased ferroelectric transistor MC belonging to the threshold voltage distribution D1a, and "1" data is associated with a programmed ferroelectric transistor MC belonging to the threshold voltage distribution D2b.

As described above, when a gate-source voltage Vg having a negative voltage value (e.g., voltage V5) is applied to the memory cell MC, the ferroelectric transistor MC used as the memory cell is set to the erased state.

When a gate-source voltage Vg having a positive voltage value (e.g., voltage V4) is applied to the memory cell MC, the ferroelectric transistor MC used as the memory cell is set to the programmed state.

In the description below, a voltage for setting the data holding state of the ferroelectric transistor MC to the erased state will be referred to as an erase voltage.

The erase voltage has a negative voltage value. For example, the erase voltage has a voltage value equal to or lower than voltage value Ve (e.g., Ve is V5 shown in FIG. 6).

A voltage for setting the data holding state of the ferroelectric transistor MC to the programmed state will be referred to as a program voltage (or write voltage). The program voltage has a positive voltage value.

A voltage value (e.g., the voltage level VR shown in (a) of FIG. 8) that is provided between the adjacent threshold voltage distributions D1a and D2a in order to distinguish the plurality of threshold voltage distributions is called a read level.

When the data stored in the ferroelectric transistor MC is read, a read voltage having one or more read levels VR is applied to the gate of that ferroelectric transistor MC.

When the ferroelectric transistor MC is turned on by application of the read level VR, the ferroelectric transistor MC has a threshold voltage equal to or lower than the read level VR. When the ferroelectric transistor MC is turned off by application of the read level VR, the ferroelectric transistor MC has a threshold voltage higher than the read level VR.

The data stored in the ferroelectric transistor MC is read out by detecting a signal determined by the on/off state of the ferroelectric transistor MC.

The voltage level (hereinafter referred to as a read pass voltage) VREAD is provided at a voltage level higher than the threshold voltage distribution D1a of the erased state. When the voltage level VREAD is applied to the ferroelectric transistor, the ferroelectric transistor MC is turned on without reference to the data it stores.

In (b) of FIG. 8, the graph shows a relationship of "00" data, "01" data, "10" data and "11" data to the threshold voltage of the ferroelectric transistor when the memory cell stores 2-bit data. A memory cell that stores 2-bit data is called an MLC (multi level cell).

In the case of (b) of FIG. 8, the ferroelectric transistor MC for storing 2-bit data has one of an erased state (Er state) and three programmed states (A state, B state and C state) in accordance with the data it stores.

For example, the threshold voltage distribution D1b of the Er state corresponds to a set of ferroelectric transistors MC that include a ferroelectric layer having the spontaneous polarization rate Pa shown in FIG. 6. The threshold voltage distribution D2b of the A state corresponds to a set of ferroelectric transistors MC that include a ferroelectric layer having the spontaneous polarization rate Pb shown in FIG. 6. The threshold voltage distribution D3b in the B state corresponds to a set of ferroelectric transistors MC that include a ferroelectric layer having the spontaneous polarization rate Pc shown in FIG. 6. The threshold voltage distribution D4b of the C state corresponds to a set of ferroelectric transistors MC that include a ferroelectric layer having the spontaneous polarization rate Pd shown in FIG. 6.

For example, "00" data is associated with the threshold voltage distribution (Er state distribution) D1b of the erased state. "10" data is associated with the lowest threshold voltage distribution (C state distribution) D4b of the four threshold voltage distributions. "01" data is associated with the threshold voltage distribution (A state distribution) D2b adjacent to the threshold voltage distribution D1b of the erased state. "11" data is associated with the threshold voltage distribution D3b between the threshold voltage distribution (C state distribution) D4b and the threshold voltage distribution (A state distribution) D2b.

Read levels VAR, VBR and VCR are provided between two adjacent threshold voltage distributions, respectively.

By application of the read level VAR, it is determined whether the threshold voltage of the ferroelectric transistor MC has a value belonging to the erased state (Er state) or a value belonging to the programmed states (the A state, the B state and the C state).

By application of the read level VCR, it is determined whether the threshold voltage of the ferroelectric transistor MC has a value belonging to the C state, or a value belonging to one of the B state, A state and Er state. By application of the read level VBR, it is determined whether the threshold voltage of the ferroelectric transistor MC has a value belonging to one of the A state and the Er state, or a value belonging to one of the B state and C state.

By application of the read levels VAR and VCR, the lower bit data of the 2-bit data is read. For example, by application of the read level VBR, the upper bit data of the 2-bit data is read.

In this manner, the ferroelectric transistor is applicable to a memory device as a memory cell. Thus, a ferroelectric memory is provided.

(1b) Operation Example

An operation example of the memory device (ferroelectric memory) of the present embodiment will be described with reference to FIGS. 9 to 17.

In the description below, a memory cell (ferroelectric transistor) MC to be operated will be referred to as a selected cell. A memory cell string including the selected cell (a memory cell string to be operated) will be referred to as a selected string. A string unit including the selected string (a string unit to be operated) will be referred to as a selected string unit. A block including the selected string unit (a block to be operated) will be referred to as a selected block.

Memory cells other than the selected cell will be referred to as non-selected cells. Memory cell strings other than the selected string will be referred to as non-selected strings. String units other than the selected string unit will be referred to as non-selected string units. Blocks other than the selected block will be referred to as non-selected blocks.

In the description below, operation sequences that are performed for a memory cell (SLC) storing 1-bit data will be described for the simplicity of description.

(1b-1) Read Sequence

Figure 9:
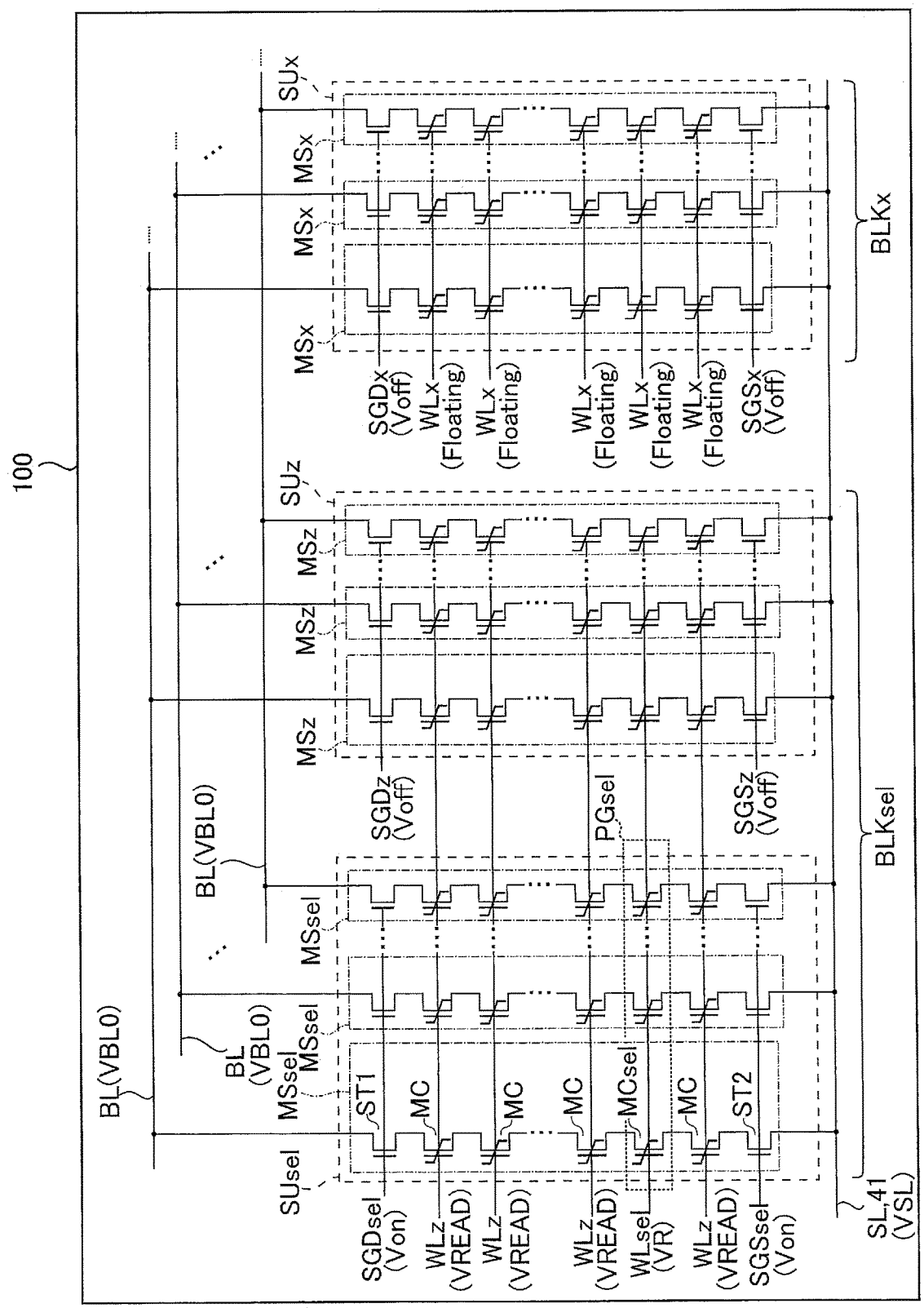

FIG. 9 is a schematic diagram for illustrating a read sequence performed in the ferroelectric memory of the present embodiment.

The memory controller 2 sends a read command and a selection address to the ferroelectric memory 1.

The ferroelectric memory 1 of the present embodiment executes a read sequence for the area of the memory cell array 100 indicated by the selection address, based on the read command.

At the time of the read sequence, the string unit SUsel and the block BLKsel, which include a selected cell MCsel to be read, are set to the selected state.

The sequencer 190 applies a voltage VBL0 to the bit line BL. When the read operation in the read sequence is executed in units of page (in units of cell unit), a plurality of bit lines BL belonging to the selected page PGsel of the selected string unit SUsel are set to the selected state by application of the voltage VBL0. The VBL0 has a positive voltage value.

It should be noted that all bit lines BL do not be set to the selected state, depending upon a data read method to be used.

The sequencer 190 applies a voltage VSL to the source line SL (and the semiconductor layer 41). The voltage VSL is, for example, the ground voltage.

The sequencer 190 applies a selection voltage Von to the drain-side select gate line (selected drain-side select gate line) SGDsel of the selected string unit SUsel in the selected block BLKsel. The potential difference between the selection voltage Von and the voltage VBL0 is set to a potential difference at which the drain-side select transistor ST1 coupled to the bit line BL can be turned on.

As a result, the plurality of drain-side select transistors ST1 coupled to the selected drain-side select gate line SGDsel are turned on.

The selected string MSsel coupled to the selected drain-side select gate line SGD is electrically coupled to the bit line BL via the select transistor ST1 that is in the on state.

If a non-selected bit line exists depending upon the data read method that is being used, the voltage value applied to the non-selected bit line may be properly set such that the select transistor ST1 coupled to the non-selected bit line and the selected drain-side select gate line SGDsel is in the cutoff state.

The sequencer 190 applies a voltage Von to the source-side select gate line (selected source-side select gate line) SGSsel of the selected string unit SUsel in the selected block BLKsel. As a result, the source-side select transistor ST2sel coupled to the selected select gate line SGSsel is turned on.

The selected string MSsel coupled to the selected source-side select gate line SGSsel is electrically coupled to the semiconductor layer 41 and the source line SL via the select transistor ST2 that is in the on state.

The sequencer 190 applies a voltage Voff to the drain-side select gate line (non-selected drain-side select gate line) SGDz of the non-selected string unit SUz in the selected block BLKsel. As a result, the drain-side select transistor ST1 coupled to the non-selected drain-side select gate line SGDz is turned off.

Therefore, the non-selected string MSz coupled to the non-selected drain-side select gate line SGDz is electrically isolated from the bit line BL by the select transistor ST1 that is in the off state.

The sequencer 190 applies a voltage Voff to the source-side select gate line (non-selected source-side select gate line) SGSz of the non-selected string unit SUz in the selected block BLKsel. As a result, the source-side select transistor ST2 coupled to the non-selected source-side select gate line SGSz is turned off.

Therefore, the non-selected string MSz coupled to the non-selected source-side select gate line SGSz is electrically isolated from the source line SL by the select transistor ST2 that is in the off state.

As described above, the ferroelectric memory of the present embodiment can selectively activate string units which are in the selected block BLKsel and to which a group (selected page PGsel) including one or more selected cells MCsel belongs, by controlling the potentials of the drain-side and source-side select gate lines SGD and SGS.

In the selected block BLKsel, the non-selected string unit SUz is deactivated.

In the selected block BLKsel, a non-selection voltage (read pass voltage) VREAD is applied to the non-selected word line WLz. The non-selected cell MCz coupled to the non-selected word line WLz is turned on without reference to the data it stores.

A read voltage with a read level VR is applied to the selected word line WLsel. With respect to the memory cell MC that stores 1-bit data, the read level VR has a voltage value between two threshold voltage distributions D1a and D2a.

When the threshold voltage of the selected cell MCsel is equal to or lower than the voltage value of the read level VR, the selected cell MCsel is turned on. In this case, the bit line BL is electrically coupled to the source line SL via the selected cell in the on state (and the non-selected cell MCz in the on state and the select transistors ST1 and ST2 in the on state). As a result, a cell current flows between the bit line BL and the source line SL via the selected string MSsel.

When the threshold voltage of the selected cell MCsel is higher than the voltage value of the read level VR, the selected cell MCsel is turned off. In this case, the bit line BL is electrically isolated from the source line SL by the selection cell MCsel that is in the off state. As a result, a cell current does not flow between the bit line BL and the source line SL.

The sense amplifier circuit 150 senses and amplifies the generated cell current.

The sense amplifier circuit 150 determines data in the selected cell MCsel, based on the sense result of the cell current. The sense amplifier circuit 150 outputs a signal based on the determination result, as data in the selected cell MCsel. As a result, the read data in the selected cell MCsel is transferred from the ferroelectric memory 1 to the memory controller 2.

The sense amplifier circuit 150 may determine the data in the selected cell MCsel, based on a detection result of a fluctuation of the potential of the bit line BL in accordance with the cell current.

At the time of the read sequence, in the non-selected block BLKx, the potential state of the non-selected word line WLx is set to the floating state. In each non-selected string unit SUx of the non-selected block BLKx, a voltage Voff is applied to the non-selected drain-side and source-side select gate lines SGDx and SGSx. As a result, the memory cell strings MS in the non-selected block BLKx are electrically isolated from the bit line BL and the source line SL during the read sequence.

Thereafter, the sequencer 190 returns the potential of each interconnect to the initial state (e.g., the precharge state, the ground voltage applied state, or the floating state).

As described above, in the ferroelectric memory of the present embodiment, data in the memory cell array 100 is read by the read sequence.

It should be noted that one memory cell in the selected string unit may be set to the selected state, and data may be read from that selected cell.

(1b-2) Erase Sequence

FIG. 10 is a schematic diagram for illustrating an erase sequence performed in the ferroelectric memory of the present embodiment.

The memory controller 2 sends an erase command and a selection address to the ferroelectric memory 1.

The ferroelectric memory 1 of the present embodiment executes an erase sequence for the area in the memory cell array 100 indicated by the selection address, based on the erase command.

At the time of the erase sequence, the string unit and the block, which include the memory cell to be erased, are set to the selected state.

For example, the erase operation in the erase sequence is executed in units of one block.

During the erase sequence executed in units of block, the sequencer 190 applies a voltage Vg1a to all drain-side select gate lines SGDsel of the selected block BLKsel. For example, the voltage Vg1a is 2V.

The sequencer 190 applies a voltage VSGsel2 to all source-side select gate lines SGSsel in the selected block BLKsel. The voltage VSGsel2 is 0V.

As a result, all string units SUsel and the memory cell strings MSsel in the selected block BLKsel are set to the selected state.

In the non-selected block BLKx, the sequencer 190 applies a voltage Vg1x to the non-selected drain-side select gate line SGDx. In the non-selected block BLKx, the sequencer 190 applies a voltage Vunsel to the non-selected source-side select gate line SGSx. For example, the voltage Vg1x is 2V. For example, the voltage Vunsel is 4V.

Thus, all string units SUx and memory cell strings MSx in the non-selected block BLKx are set to the non-selected state.

The sequencer 190 applies a voltage VWLsel to all word lines WLsel in the selected block BLKsel. For example, the voltage VWLsel is 0V.

In the non-selected block BLKx, the sequencer 190 sets the potential state (electric potential state) of each non-selected word line WLx to an electrically floating state.

The sequencer 190 applies a voltage Vd to all bit lines BL coupled to the selected block BLKsel. For example, the voltage Vd is 4V.

A voltage Vg1a (e.g., 0V) is applied to the gate of the drain-side select transistor ST1, and a voltage Vd (e.g., 4V) is applied to the drain of the drain-side select transistor ST1. In this case, the select transistor ST1 coupled to the selected drain-side select gate line SGDsel is turned off.

The sequencer 190 applies a voltage Vs to the source line SL and the semiconductor layer 41 (and the well interconnect CPWELL) coupled to the selected block BLKsel. For example, the voltage Vs is 4V.

A voltage VSGsel2 (e.g., 0V) is applied to the gate of the source-side select transistor ST2. A voltage Vs (e.g., 4V) is applied to the source of the source-side select transistor ST2.

As a result, the select transistor ST2 coupled to the selected source-side select gate line SGSsel is turned on.

Holes (hi) caused by the p-type semiconductor layer 41 are supplied into the semiconductor layer 61 from the source side of the memory cell string MSsel via the select transistor ST2 that is in the on state. As a result, the semiconductor layer 61 is positively charged.

Thus, the potential (electric potential) of the semiconductor layer 61 rises by application of the voltage to each interconnect. For example, the potential of the semiconductor layer 61 is approximately 4V.

As a result, a potential difference (electric potential difference) Vcell is caused between the gate (word line WLsel) of the selected cell MCsel and the channel region (semiconductor layer 61) of the selected cell MCsel. In the description below, the potential difference Vcell between the gate of the memory cell MC and the channel region of the memory cell MC will be referred to as a cell application voltage Vcell.

In the erase sequence, the potential of the gate of the selected cell MCsel is lower than the potential of the channel region of the selected cell MCsel. In this case, the cell application voltage Vcell applied between the gate and the channel region of the selected cell MCsel has a negative voltage value (a voltage having a negative polarity).

Therefore, in the erase sequence, the cell application voltage Vcell having a negative voltage value causes the erase operation to be performed on the selected cell MCsel. For example, in the erase operation, the voltage value of the cell application voltage Vcell has a value equal to or lower than the voltage value of the voltage V5 shown in FIG. 6.

In the description below, the cell application voltage for setting the memory cell to the erased state will be referred to as an erase voltage (VERA). The lower limit voltage value of the erase voltage VERA is set to be equal to or lower than a predetermined voltage value.

Thus, the spontaneous polarization state of the ferroelectric transistor of the selected cell MCsel becomes an erased state (e.g., the state shown in (a) of FIG. 7).

In this manner, the plurality of selected cells MCsel in the selected block BLKsel are set to the erased state. By this erase operation, the data in a plurality of memory cells in the selected block is erased.

In the non-selected block BLKx, the select transistors ST1 and ST2 are in the off state. Therefore, the memory cell strings MSx in the non-selected block BLKx are electrically isolated from the bit line BL and the source line SL. Due to the floating state of the word lines WLx, the voltage value of the cell application voltage of the memory cell MC in the non-selected block does not reach a negative voltage value. Therefore, the memory cells in the non-selected blocks BLKx do not transition to the erased state.

Thereafter, the sequencer 190 returns the potential state of each interconnect to the initial state (e.g., the precharge state, the ground voltage applied state, or the floating state).

In the manner described above, the erase sequence in the ferroelectric memory of the present embodiment comes to an end.

In the erase sequence, after an erase operation, a verifying operation related to the erase operation (hereinafter referred to as erase verification) may be executed. In the erase verification, it is verified whether or not the threshold voltage of the selected cell MC has reached a predetermined voltage value corresponding to the threshold voltage distribution in the erased state.

For example, when the threshold voltage of a selected cell is equal to or higher than a predetermined voltage value (referred to as an erase verification level) in the ferroelectric memory, the erase verification for that selected cell is determined as a pass. If the threshold voltage of the selected cell is lower than the erase verification level, the erase verification for that selected cell is determined as a fail.

For a plurality of selected memory cells to be erased, the erase operation and erase verification are repeatedly executed until the number of memory cells for which a fail is determined (or the number of memory cells for which a pass is determined) reaches a threshold value indicating the end of the erase sequence.

In the present embodiment, the erase operation performed in units of block is mentioned as an example. However, the erase operation may be executed in units smaller than block BLK (e.g., subblock or page).

(1b-3) Write Sequence

FIGS. 11 to 17 are diagrams for illustrating a write sequence performed in the ferroelectric memory of the present embodiment.

Figure 11:
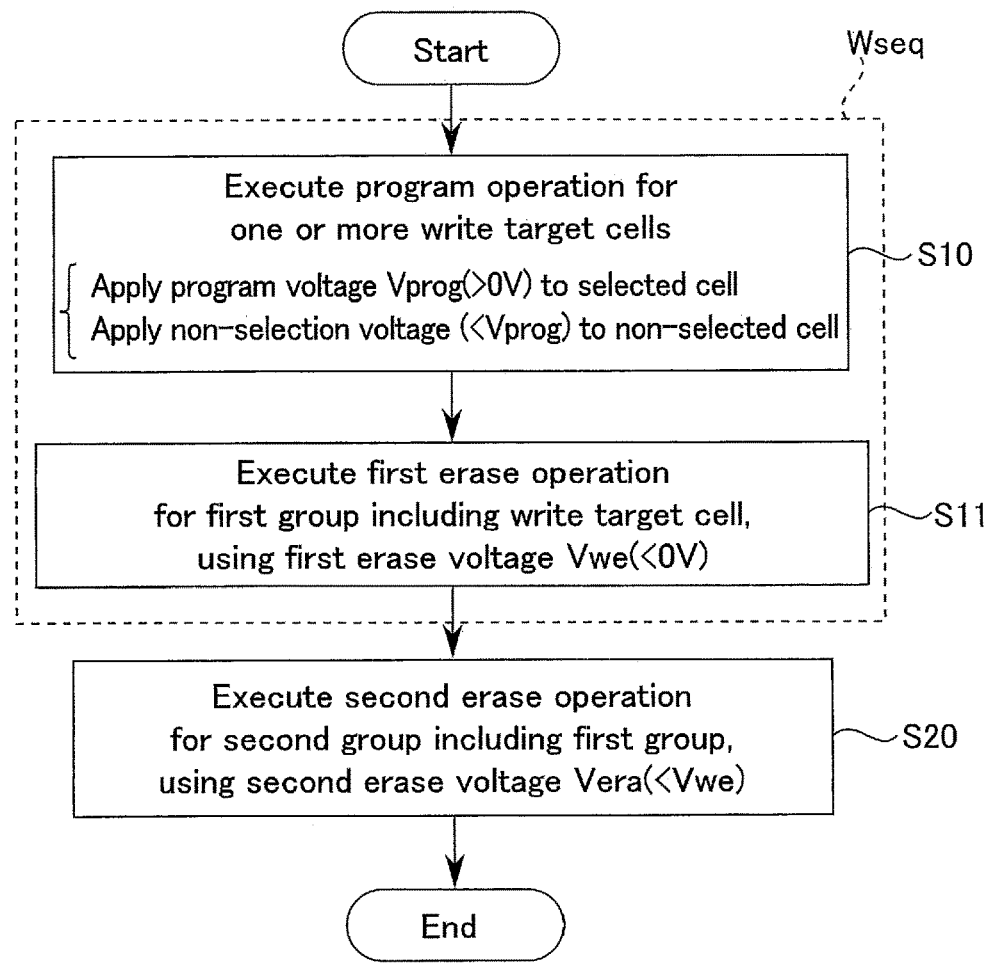
FIG. 11 is a flowchart showing an operation example of the memory device of the first embodiment.
Figure 12:
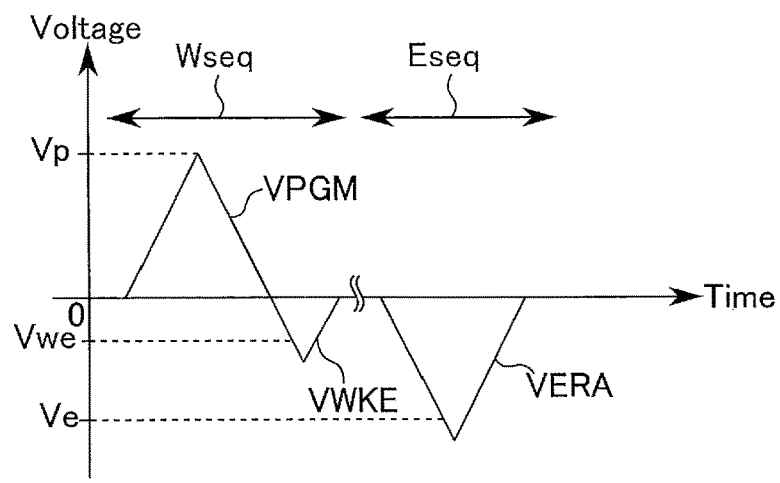
FIG. 12 is a waveform diagram showing an operation example of the memory device of the first embodiment.

FIG. 11 is a flowchart showing a process flow of the write sequence performed in the ferroelectric memory of the present embodiment. FIG. 12 is a waveform diagram showing a voltage (cell application voltage) applied to a selected cell in the write sequence performed in the ferroelectric memory of the present embodiment. In FIG. 12, the horizontal axis of the waveform diagram corresponds to time, and the vertical axis of the waveform diagram corresponds to the cell application voltage.

As shown in FIG. 11, the write sequence Wseq of the ferroelectric memory of the present embodiment includes at least a program operation (S10) and a weak erase operation (S11).

As shown in FIG. 12, in each operation of the write sequence, voltages VPGM and VWKE each having a predetermined voltage value are applied to the memory cell to which data is to be written, according to the process flow.

<S10: Program Operation>

Figure 13:
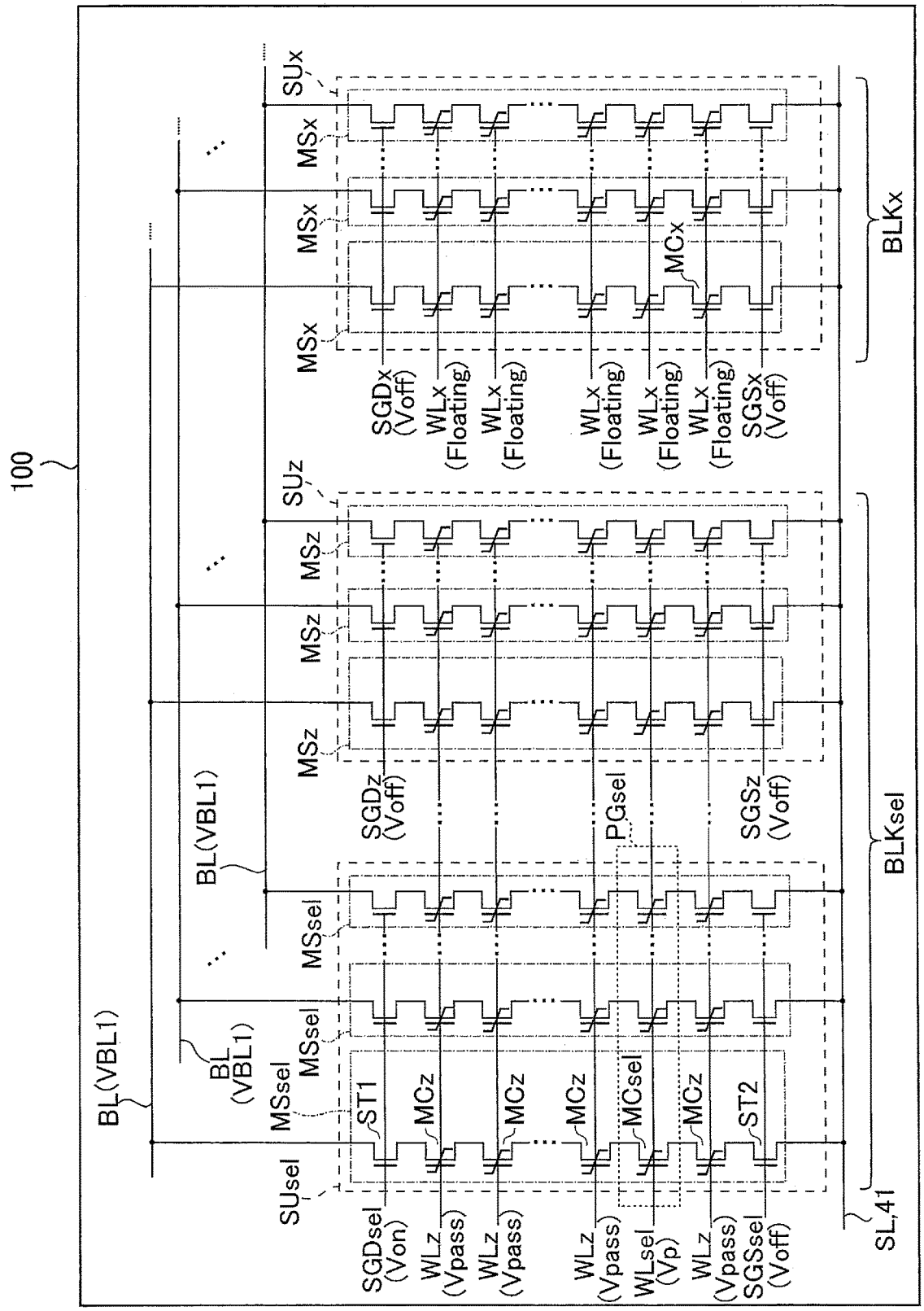

FIG. 13 is a schematic diagram for illustrating a voltage applied to each interconnect of the memory cell array during the program operation of the ferroelectric memory of the present embodiment.

In the write sequence, the memory controller 2 sends a write command, a selection address and write data to the ferroelectric memory 1.

The ferroelectric memory 1 of the present embodiment executes the program operation of write data of the write sequence for the area of the memory cell array 100 indicated by the selection address, based on the write command.

For example, in the write sequence, the selected cell is set to the erased state as the initial state. During the write sequence, the erase operation described above may be performed before the start of the program operation.

In the write sequence, the sequencer 190 executes various controls for the program operation.

The sequencer 190 causes the row control circuit 140 and the sense amplifier circuit 150 to set the string unit and block including a memory cell to which the data is to be written to the selected state.

For example, in the write sequence, the program operation is executed in units of one page.

In the program operation, the sequencer 190 applies a voltage Von to the selected drain-side select gate line SGDsel of the selected block BLKsel. By application of the voltage Von, the select transistor ST1 coupled to the selected drain-side select gate line SGDsel is turned on. As a result, the memory cell string MSsel belonging to the selected page PGsel is electrically coupled to the bit line BL via the select transistor ST1 that is in the on state.

The sequencer 190 applies a voltage Voff to the selected source-side select gate line SGSsel in the selected block BLKsel. By application of the voltage Voff, the select transistor ST2 coupled to the selected source-side gate line SGDsel is turned off. As a result, the memory cell string MSsel belonging to the selected page. PGsel is electrically isolated from the source line SL by the select transistor ST2 that is in the off state.

The sequencer 190 applies a voltage Voff to the non-selected drain-side select gate line SGDz and the non-selected source-side select gate line SGSz in the selected block BLKsel. By application of the voltage Voff, the select transistor ST1 coupled to the non-selected drain-side select gate line SGDz is turned off. By application of the voltage Voff, the select transistor ST2 coupled to the non-selected source-side select gate line SGSz is turned off.

As a result, the non-selected string MSz of the non-selected string unit SUz in the selected block BLKsel is electrically isolated from the bit line BL and the source line SL.

In the non-selected block BLKx, the sequencer 190 applies the voltage Voff to the non-selected drain-side select gate line SGDx and the non-selected source-side select gate line SGSx. The non-selected string MSx in the non-selected block BLKx is electrically isolated from the bit line BL and the source line SL by the select transistors ST1 and ST2 that are in the off state.

The sequencer 190 applies a voltage VBL1 to the plurality of bit lines BL coupled to the cell unit CU including the selected page PGsel. The voltage value of the voltage VBL1 depends on data ("0" or "1") to be written in each selected cell MCsel. For example, a voltage VBL1 of 0V (ground voltage Vss) is applied to the bit line BL coupled to the selected cell MCsel to which "1" data is to be written. A voltage VBL1 having a positive voltage value is applied to the bit line BL coupled to the memory cell to which "0" data is to be written.

For example, the sequencer 190 applies a predetermined voltage to the source line SL. Alternatively, the sequencer 190 sets the source line SL to an electrically floating state.

The sequencer 190 applies a non-selection voltage (hereinafter referred to as a write pass voltage) Vpass to the non-selected word line WLz in the selected block BLKsel. For example, the voltage value of the write pass voltage Vpass has a positive voltage value. By the application of the write pass voltage Vpass, the non-selected cell MCz is turned on.

The sequencer 190 applies a selection voltage Vp to the selected word line WLsel in the selected block BLKsel. The voltage value of the selection voltage Vp has a positive voltage value. The voltage value of the selection voltage Vp is higher than that of the write pass voltage Vpass. The voltage value of the selection voltage Vp is higher than the positive voltage value of the voltage VBL1.

In the non-selected block BLKx, the sequencer 190 sets the potential state of each non-selected word line WLx to a floating state.

During the program operation, the voltage VBL1 of each bit line BL is applied to the corresponding semiconductor layer 61 via the drain-side select transistor ST1 that is in the on state.

The voltage VBL1 is transferred to the channel region of the selected cell MCsel via the non-selected cell MCz that is in the on state.

The potential difference between the selection voltage Vp and the bit line voltage VBL1 corresponds to the cell application voltage Vcell. When the potential of the gate in the memory cell (ferroelectric transistor) MC is higher than the potential of the channel region, the cell application voltage Vcell has a positive voltage value.

In the channel region of the selected cell MCsel in which "0" data is to be programmed, the potential of the semiconductor layer 61 is increased by the bit line BL to which a positive voltage value is applied (for example, by the channel boost caused by transfer of voltage VBL1 or cutoff of the select transistors). This reduces the potential difference between the selected word line WLsel and the channel region. For example, the cell application voltage (hereinafter referred to as "Vcell-0") in the selected cell MCsel in which "0" data is to be programmed is approximately equal to the voltage V1 shown in FIG. 6 (or 0V), depending upon a setting of the voltage value of the voltage VBL1.

Therefore, the selected cell MCsel in which the "0" data is to be programmed maintains the erased state.

The voltage VBL1 of 0V is transferred to the channel region of the selected cell MCsel in which the "1" data is to be written. Therefore, the cell application voltage (hereinafter referred to as "Vcell-1") of the selected cell MCsel in which the "1" data is to be written becomes higher than the cell application voltage Vcell-0.

In this case, as shown in FIG. 12, during the program operation, the cell application voltage Vcell having a positive voltage value is applied as the program voltage VPGM to the selected cell MCsel in which the "1" data is to be written. For example, the program voltage VPGM has a triangular wave pulse shape.

For example, the cell application voltage Vcell-1 is set to be approximately equal to the voltage V4 shown in FIG. 6.

FIG. 14 is a schematic diagram for illustrating the spontaneous polarization state of the memory cell during the program operation.

As shown in FIG. 14, when a program voltage VPGM having a positive voltage value is applied to the ferroelectric transistor of a selected cell MCsel, the polarization of the ferroelectric layer 65 of the ferroelectric transistor MC is reversed. As a result, the spontaneous polarization state of the ferroelectric layer 65 changes from the negative spontaneous polarization state to the positive spontaneous polarization state plz2.

At this time, by application of the program voltage VPGM, electrons 99 may be trapped in the insulating layer 63, in the region (e.g., the interface) between the insulating layer 63 and the ferroelectric layer 65, or in the region (e.g., the interface) between the insulating layer 63 and the semiconductor layer 61.

Due to the electrons 99 that are trapped (hereinafter referred to as trapped electrons), the memory window of the memory cell MC (the difference between the threshold voltage of the ferroelectric transistor in the "1" data holding state and the threshold voltage of the ferroelectric transistor in the "0" data holding state) may narrow or disappear.

The ferroelectric memory 1 of the present embodiment discharges (detraps) trapped electrons 99 from the memory cell MC by a weak erase operation (S11) executed after the program operation (S10).

<S11: Weak Erase Operation>

As shown in FIGS. 11 and 12, in the write sequence of the ferroelectric memory of the present embodiment, a weak erase operation (hereinafter referred to as a detrap operation as well) is executed after the program operation.

In the write sequence, the sequencer 190 executes various operations for the weak erase operation.

For example, in the write sequence, the weak erase operation is performed in units of page.

Figure 15:
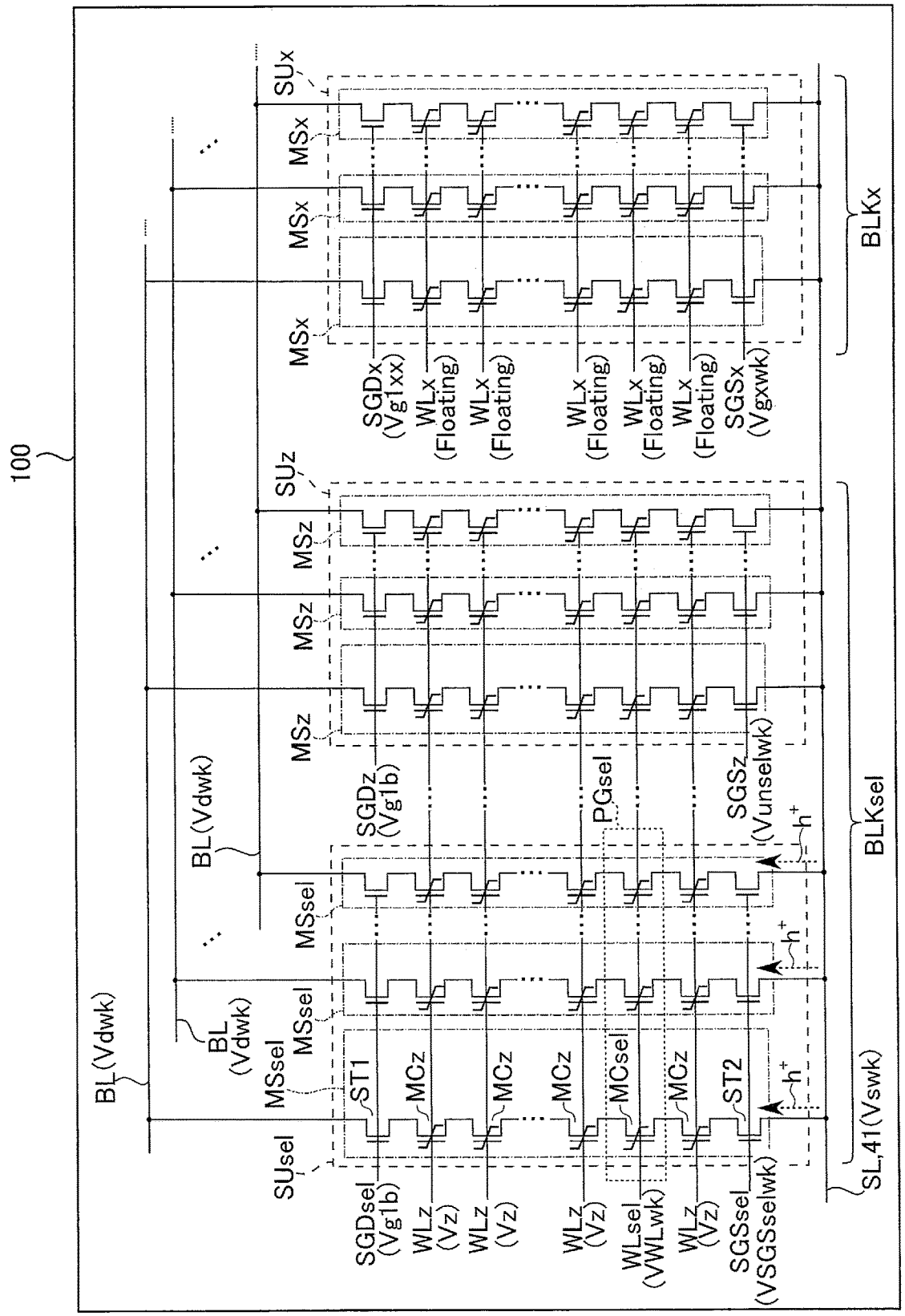

FIG. 15 is a schematic diagram for illustrating a voltage that is applied to each interconnect of the memory cell array in the weak erase operation of the ferroelectric memory of the present embodiment is weakly erased.

As shown in FIG. 15, in the selected block BLKsel, the sequencer 190 applies a voltage Vdwk to the bit line BL. The sequencer 190 applies a voltage Vswk to the source line SLsel. For example, the voltage value of the voltage Vdwk is 3V. The voltage value of the voltage Vswk is 3V.

When the weak erase operation is executed in units of page, the sequencer 190 controls potentials applied to the selected word line WLsel, select gate lines SGDsel and SGSsel and non-selected word line WLz that correspond to the selection address of a write target.

The sequencer 190 applies a voltage Vg1b to the selected drain-side select gate line SGDsel of the selected string unit SUsel. For example, the voltage value of the voltage Vg1b is approximately 0V.

The sequencer 190 applies a voltage VSGSselwk to the selected source-side select gate line SGSsel of the selected string unit SUsel. For example, the voltage value of the voltage VSGSselwk is approximately 0V.

The sequencer 190 applies, for example, a voltage Vg1*b* to the non-selected drain-side select gate line SGDz of the non-selected string unit SUz.

The sequencer 190 applies a voltage Vunselwk to the non-selected source-side select gate line SGSz of the non-selected string unit SUz. For example, the voltage value of the voltage Vunselwk is approximately 3V.

The sequencer 190 applies a non-selection voltage (hereinafter referred to as a weak erase pass voltage) Vz to a plurality of non-selected word lines WLz of the selected block BLKsel. The non-selection voltage Vz is, for example, approximately 1V.

The sequencer 190 applies a selection voltage VWLwk to the selected word line WLsel. The selection voltage VWLwk is lower than the non-selection voltage Vz. The selection voltage VWLwk is lower than the voltages Vdwk and Vswk. For example, the selection voltage VWLwk is approximately 0V.

The selected word line WLsel during the weak erase operation is in the same state as the selected word line during the program operation.

With respect to the non-selected block BLKx, the sequencer 190 sets the potential state of the non-selected word line WLx to an electrically floating state. The sequencer 190 applies a voltage Vg1*xx* (0V in the present case) to the non-selected drain-side select gate line SGDx. The sequencer 190 applies a voltage Vgxwk (3V in the present case) to the non-selected source-side select gate line SGSx.

The voltage Vg1*b* (0V in the present case) of the selected drain-side select gate line SGDsel is lower than the voltage Vdwk (3V in the present case) of the bit line BL. As a result, the select transistor ST1 coupled to the selected drain-side select gate line SGDsel is turned off.

The voltage VSGSselwk (0V in the present case) of the selected source-side select gate line SGSsel is lower than the voltage Vswk (3V in the present case) of the source line SL. As a result, the select transistor ST2 coupled to the selected source-side select gate line SGSsel is turned on.

In the plurality of selected strings MSsel included in the selected page PGsel, the p-type semiconductor layer 41 is electrically coupled to the semiconductor layer 61 via the source-side select transistor ST2 that is in on state.

Due to the potential difference between the semiconductor layer 41 and the selected word line WLsel (and the non-selected word line WLz), holes (h$^+$) are injected from the p-type semiconductor layer 41 into the semiconductor layer 61 via the source-side select transistor ST2.

As a result, the potential of the semiconductor layer 61 rises. For example, the potential of the semiconductor layer 61 (the channel region CHN of the ferroelectric transistor MC) is approximately equal to voltage Vswk (e.g., 3V).

In the non-selected string MSz, the select transistor ST1 coupled to the non-selected drain-side select gate line SGDz is turned off in the same manner as the select transistor ST1 coupled to the selected drain-side select gate line SGDsel.

In the non-selected string MSz, the voltage Vunselwk (3V in the present case) of the non-selected source-side select gate line SGSz is the same as the voltage Vswk (3V in the present case) of the source line SL. In this case, the select transistor ST2 coupled to the non-selected source-side select gate line SGSz is turned off.

The semiconductor layer 61 of the non-selected string MSz of the selected block BLKsel is electrically isolated from the source line SL (and the p-type semiconductor layer 41) by the select transistor ST2 that is in the off state.

For example, the potential of the semiconductor layer 61 of the non-selected string MSz increases and approximately corresponds to the potential difference (1V in the present case) between the selected word line WLsel and the non-selected word line WLz, due to the capacitive coupling between the word lines WLsel and WLz.

Due to the increase in the potential of the semiconductor layer 61 of the selected string MSsel, the potential of the channel region of the selected cell MCsel (the potential of the semiconductor layer 61) is higher than the potential of the gate of the selected cell MCsel (the potential of the selected word line WLsel) during the weak erase operation.

Therefore, the cell application voltage Vcell-we (=VWLwk-Vswk) during the weak erase operation has a negative voltage value.

As shown in FIG. 12, during the weak erase operation, the cell application voltage Vcell having a negative voltage value is applied to the selected cell MCsel as a weak erase voltage VWKE.

For example, the weak erase voltage VWKE has a triangular wave pulse shape.

Figure 16:
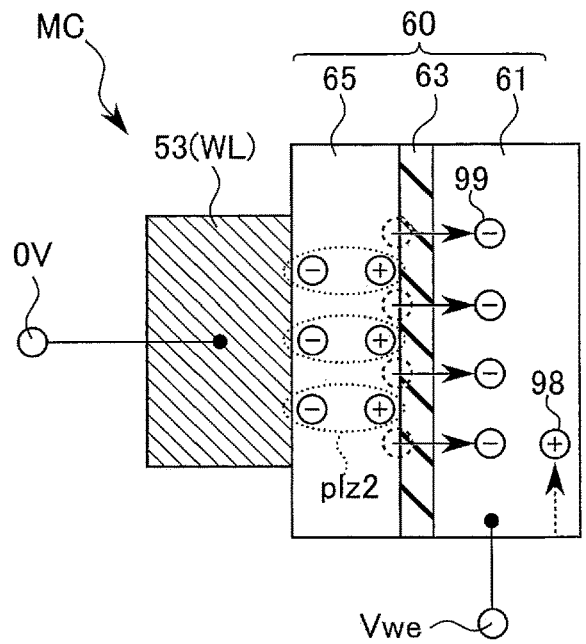

FIG. 16 is a schematic diagram for illustrating the polarization state of the memory cell during the weak erase operation.

As shown in FIG. 16, the potential of the semiconductor layer 61 is higher than the potential of the gate of the selected cell MCsel during the weak erase operation due to the supply of holes 98. The cell application voltage Vcell-wk having a negative voltage value is applied to the selected cell MCsel.

The electric field caused by the negative cell application voltage Vcell causes the electrons 99 trapped in the ferroelectric layer 65 and the insulating layer 63 to be emitted (detrapped) into the semiconductor layer 61.

As a result, the influence of the trapped electrons on the ferroelectric transistor MC is suppressed.

The polarity of the weak erase voltage VWKE is the same as the polarity of the erase voltage VERA. The weak erase voltage VWKE is a negative voltage.

The weak erase voltage VWKE is higher than the erase voltage VERA.

The lower limit voltage value of the erase voltage VERA is equal to or lower than the negative voltage value Ve.

The lower limit voltage value of the weak erase voltage VWKE is higher than the voltage value Ve and is equal to or lower than the negative voltage value Vwe.

The polarity of the weak erase voltage VWKE is opposite to the polarity of the program voltage VPGM.

The voltage value Vwe is a voltage value that can set the polarization state of the ferroelectric layer 65 of the ferroelectric transistor MC to a negative polarization state.

When the voltage VERA having the voltage value Ve is applied to the ferroelectric transistor MCsel of the selected cell as the cell application voltage Vcell, the polarization state of the ferroelectric layer 65 changes from the programmed state (positive polarization state) to the erased state (negative polarization state).

The voltage value Vwe is a voltage value that imparts a potential difference having the same polarity as the erase voltage to the ferroelectric layer 65, without changing the polarization state of the ferroelectric layer 65 of the ferroelectric transistor MC. For example, the voltage value Vwe is a threshold value at which electrons in the layers 63 and 65 can be detrapped.

When the voltage VWKE having the voltage value Vwe is applied to the ferroelectric transistor MCsel of the selected cell as the cell application voltage Vcell, the polarization state of the ferroelectric layer 65 is maintained and the trapped electrons in the ferroelectric layer 65 (and in the insulating layer 63) are emitted into the semiconductor layer 61.

It is desired that the voltage value of the weak erase voltage VWKE does not change the polarization direction of the ferroelectric layer 65 and does not deviate from the threshold voltage of the ferroelectric transistor MC used as a memory cell within the range of the threshold voltage distribution determined by the stored data.

In the present embodiment, the voltage value (VWLwk-Vswk) of the weak erase voltage VWKE is −3V. It should be noted, however, that the voltage value is properly adjusted in accordance with the material of the ferroelectric transistor used as the selected cell, the size of the ferroelectric transistor, the film thickness of each layer, etc. For example, in the present embodiment, the voltage value of the weak erase voltage VWKE can be a value between −2.5V and −3.5V as long as the voltage value is higher than the voltage value Ve and equal to or lower than the voltage value Vwe.

The voltage value of the weak erase voltage VWKE may be equal to the voltage value Vwe.

In the present embodiment, the trapped electrons in the ferroelectric layer 65 and the insulating layer 63 are detrapped by application of the erase voltage VWKE.

After the weak erase voltage VWKE is applied, the sequencer 190 ends the weak erase operation. The sequencer 190 returns the potential of each interconnect to the initial state (e.g., the precharge state, the ground voltage applied state, or the floating state).

In the write sequence, the verify operation regarding a data program result may be executed after the weak erase operation.

In the manner described above, the sequencer 190 ends the write sequence Wseq in the ferroelectric memory of the present embodiment.

<S20>

After the weak erase operation (or verify operation) of the write sequence, the operation based on a newly supplied command is executed.

In the example shown in FIGS. 11 and 12, the sequencer 190 executes an erase sequence.

As shown in FIG. 10 described above, a voltage for the erase operation is applied to each interconnect of the selection block. The erase voltage VERA is applied to the selected cell MCsel as the cell application voltage Vcell. For example, the erase voltage VERA has a triangular wave pulse shape.

As a result, the memory cell MCsel in the selected block BLKsel is set to the erased state.

Thereafter, the sequencer 190 ends the erase sequence.

Figure 17:
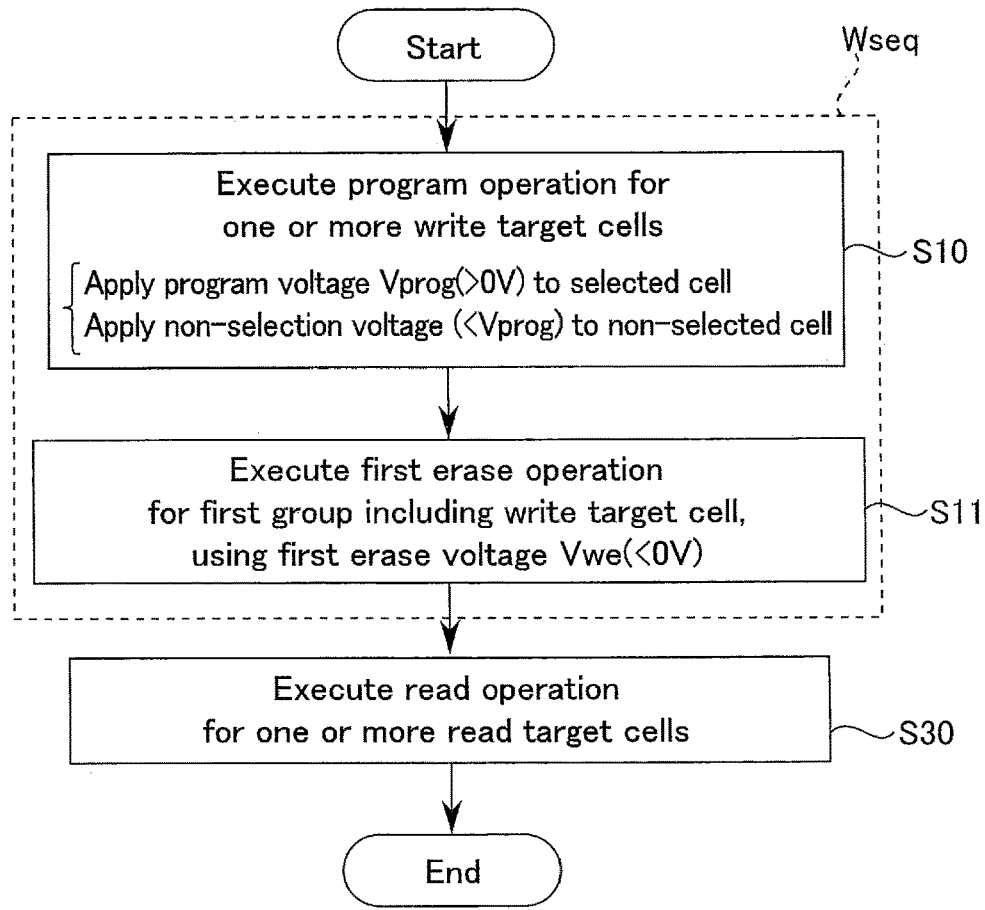
FIG. 17 is a flowchart showing an operation example of the memory device of the first embodiment.

FIG. 17 is a flowchart showing a modification of the ferroelectric memory of the present embodiment.

As shown in FIG. 17, the read sequence S30 may be executed for a certain memory cell or in units of page after the weak erase operation in the write sequence.

As described above, the ferroelectric memory of the present embodiment can execute a write sequence including a weak erase operation.

(1c) Characteristics

FIG. 18 is a graph for illustrating the characteristics of the ferroelectric memory of the present embodiment.

In FIG. 18, the horizontal axis of the graph corresponds to a gate voltage of the ferroelectric transistor used as a memory cell, and the vertical axis of the graph corresponds to a drain current of the ferroelectric transistor.

In FIG. 18, line B0 shows voltage-current characteristics of the ferroelectric transistor in the erased state.

As a comparative example, line B1 shows voltage-current characteristics of the ferroelectric transistor in the programmed state after the write sequence that does not include the weak erase operation.

Line B2 shows voltage-current characteristics of the ferroelectric transistor in the programmed state after the write sequence that includes the weak erase operation according to the present embodiment.

As shown by line B1 in FIG. 18, when the weak erase operation after the program operation is not executed, the threshold voltage of the ferroelectric transistor is higher than the threshold voltage of the dielectric transistor in the erased state even though the ferroelectric transistor is in the programmed state.

This indicates that an increase in the threshold voltage due to the trapped electrons occurs in the ferroelectric transistor.

As shown by line B2 in FIG. 18, when the weak erase operation after the program operation is executed, the threshold voltage of the ferroelectric transistor is lower than the threshold voltage of the ferroelectric transistor in the erased state.

This indicates that, in the present embodiment, the influence of the trapped electrons on the ferroelectric transistor is suppressed by the weak erase operation in which the trapped electrons is detrapped.

As described above, the ferroelectric memory of the present embodiment can suppress the influence of trapped electrons in the memory cell by executing the weak erase operation after the program operation.

(1d) Summary

The ferroelectric memory 1 of the present embodiment includes a ferroelectric transistor as a memory cell MC.

Electrons may be trapped between the ferroelectric layer 65 and the semiconductor layer 61 after the program operation is executed for the ferroelectric transistor MC used as a memory cell. The trapped electrons do not contribute to the ferroelectricity (spontaneous polarization) of the ferroelectric layer 65 and may exist in the layers 63 and 65 of the ferroelectric transistor MC in an unstable state.

The trapped electrons may adversely affect the characteristics of the ferroelectric transistor MC used as a memory cell. For example, due to the influence of trapped electrons, a desired memory window (e.g., the interval between two threshold voltage distributions) may not be secured until a relatively long time passes after the execution of the program operation.

The ferroelectric memory 1 of the present embodiment executes a weak erase operation after the program operation is executed in the write sequence.

By this weak erase operation, the ferroelectric memory 1 of the present embodiment keeps the polarization state of the ferroelectric transistor MC in a state corresponding to the stored data, and can remove the trapped electrons from the ferroelectric layer 65 and the insulating layer 63.

As a result, the ferroelectric memory 1 of the present embodiment can secure a desired memory window in a relatively short time without waiting for the trapped electrons to be naturally emitted.

As a result, the ferroelectric memory 1 of the present embodiment can stabilize the operation and characteristics of the ferroelectric transistor used as a memory cell.

As described above, the ferroelectric memory 1 of the present embodiment can improve the characteristics of the memory.

(2) Second Embodiment

A memory device of the second embodiment will be described with reference to FIGS. 19 to 21.

Figure 19:
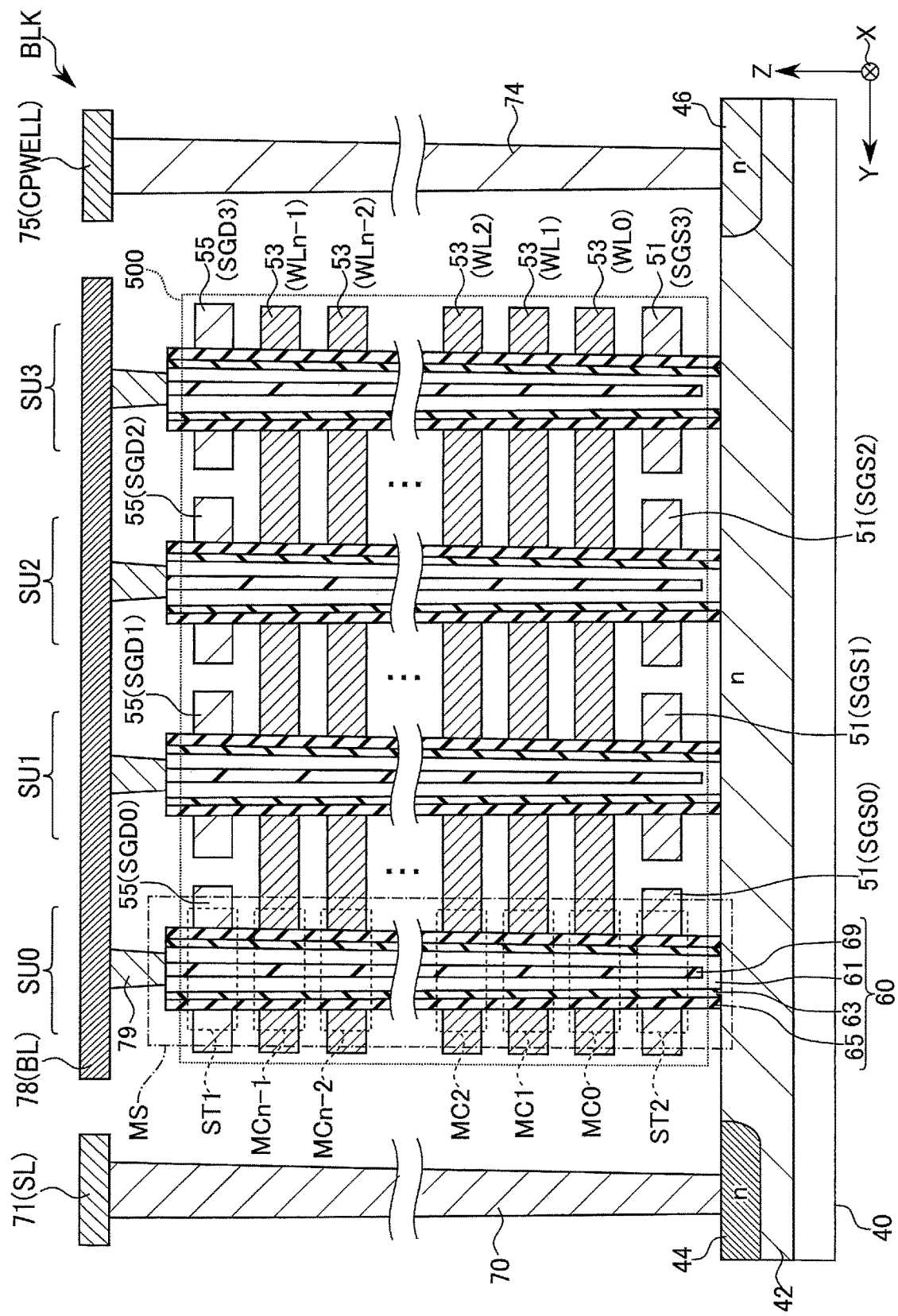
FIG. 19 is a diagram showing a configuration example of a memory device of the second embodiment.

FIG. 19 is a schematic cross-sectional view showing a configuration example of the memory device (e.g., a ferroelectric memory) of the present embodiment.

As shown in FIG. 19, the semiconductor layer on a substrate 40 may be an n-type semiconductor layer 42. A memory pillar 60 is provided on the n-type semiconductor layer 42. A semiconductor layer 61 is coupled to the n-type semiconductor layer 42. For example, a contact plug 74 is provided on an n-type semiconductor region (diffusion layer) 44.

On the source side of a memory cell string MS, the semiconductor layer 61 is coupled to the n-type semiconductor layer 42. The source of the memory cell string MS is coupled to a source line SL via the n-type semiconductor layer 42.

In the ferroelectric memory of the present embodiment, the sequencer 190 executes a weak erase operation, as described below, after the program operation is executed in the write sequence.

Figure 20:
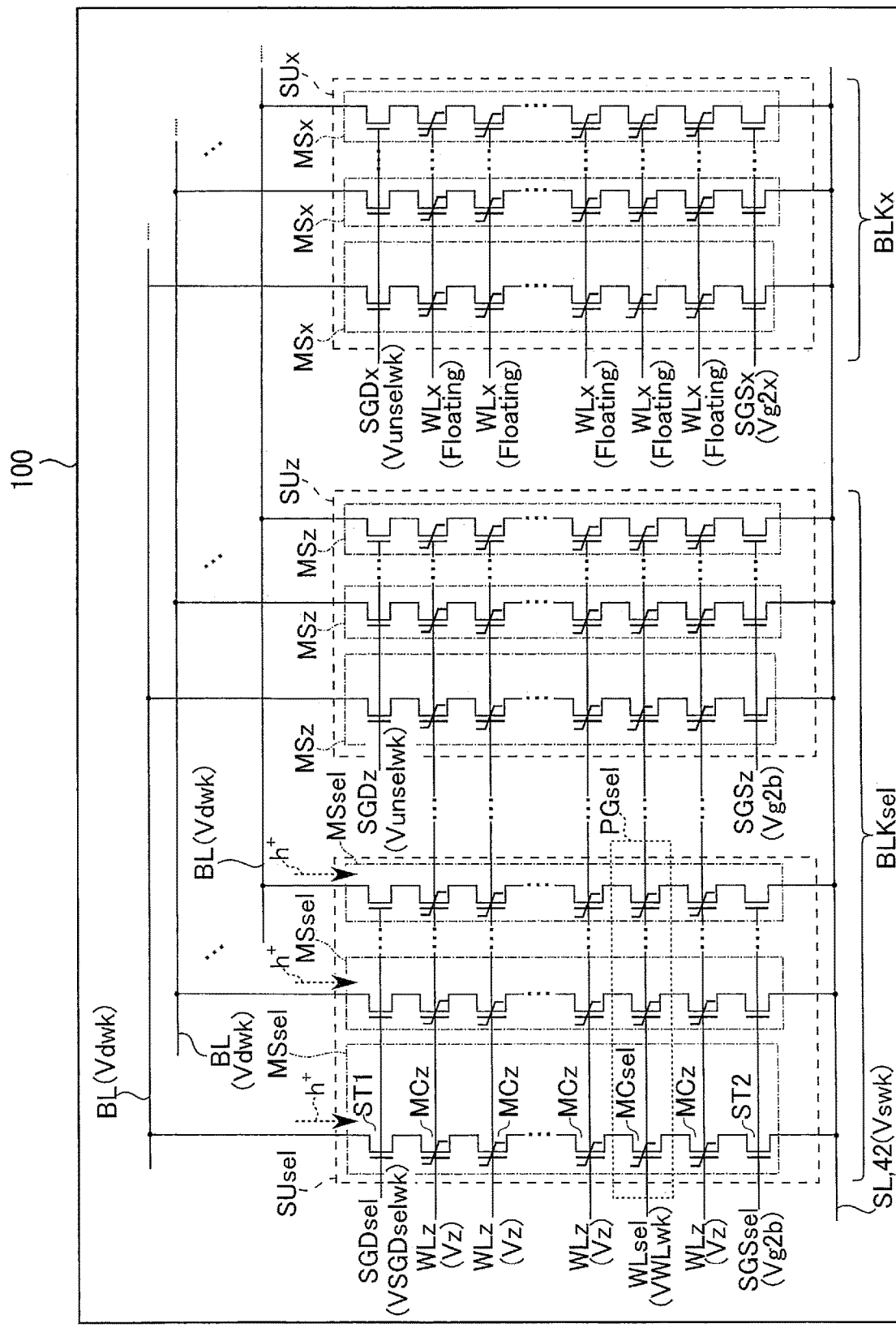
FIG. 20 and FIG. 21 are diagrams showing an operation example of the memory device of the second embodiment.

FIG. 20 schematically shows a voltage application state of each interconnect during the weak erase operation of the ferroelectric memory of the present embodiment.

In the present embodiment, the program operation in the write sequence is substantially the same as the above-mentioned example of the program operation (refer to FIGS. 12 and 13, for example), and thus a description thereof is omitted herein. It should be noted, however, that the voltage value of the voltage applied to each interconnect may be changed as appropriate.

In the present embodiment, during the weak erase operation after the program operation, the sequencer 190 controls the potential of each interconnect in the selected block BLKsel, as described below.

As shown in FIG. 20, the sequencer 190 applies a voltage Vdwk (e.g., 3V) to the bit line BL. The sequencer 190 applies a voltage Vswk (e.g., 3V) to the source line SL. The voltage Vswk is applied to the n-type semiconductor layer 42 via the source line SL.

The sequencer 190 applies a selection voltage VWLwk (e.g., 0V) to the selected word line WLsel. The sequencer 190 applies a non-selection voltage Vz (e.g., 1V) to the non-selected word line WLz.

In the selected string unit SUsel, the sequencer 190 applies a voltage VSGDselwk to the selected drain-side select gate line SGDsel. The sequencer 190 applies a voltage Vg2b to the selected source-side select gate line SGSsel of the selected string unit SUsel. The voltage value of the voltage VSGDselwk is, for example, approximately 0V. The voltage value of the voltage Vg2b is, for example, approximately 3V.

For example, in the present embodiment, the select transistor ST1 coupled to the selected drain-side select gate line SGDsel is turned on. The select transistor ST2 coupled to the selected source-side select gate line SGSsel is turned off.

The sequencer 190 applies a voltage Vunselwk to the non-selected drain-side select gate line SGDz of the non-selected string unit SUz in the selected block BLKsel. The sequencer 190 applies a voltage Vg2b to the non-selected source-side select gate line SGSz of the non-selected string unit SUz. The voltage Vg2b is, for example, 3V. In the present embodiment, the select transistor ST1 coupled to the non-selected drain-side select gate line SGDz is turned off. The select transistor ST2 coupled to the non-selected source-side select gate line SGSz is turned off.

The sequencer 190 controls the potential of each interconnect in the non-selected block BLKx as follows. The sequencer 190 applies a voltage Vunselwk to the drain-side select gate line SGDx. The sequencer 190 applies a voltage Vg2x to the source-side select gate line SGSx. The sequencer 190 sets the non-selected word line WLx to an electrically floating state. As a result, the non-selected block BLKx is set to the non-selected state (non-activated state) during the weak erase operation.

As in the present embodiment, in the write sequence of the ferroelectric memory, the weak erase operation is executed by utilization of GIDL (gate induced drain leakage) generated in the drain-side select transistor ST1. With respect to a plurality of selected strings MSsel belonging to the selected page PGsel in the selected string unit SUsel, the potential of the drain of the drain-side select transistor ST1 becomes higher than the potential of the gate of the drain-side select transistor ST1 in accordance with the magnitude relationship between the voltage Vdwk applied to the bit line BL and the voltage VSGDselwk applied to the selected select gate line SGDsel.

In the present embodiment, the potential difference between the voltage Vdwk and the voltage VSGDselwk is set to be equal to or higher than a value that causes GIDL to be generated at the gate edge of the select transistor ST1 coupled to the selected select gate line SGDsel. For example, in the present embodiment, the potential difference (VSGDselwk-Vdwk) between the voltage Vdwk and the voltage VSGDselwk is −3V.

As a result, GIDL is generated at the gate edge of the select transistor ST1 to which the voltage VSGDselwk is applied.

The potential difference (voltage) that is provided between the gate and the drain for generating GIDL in the transistor is not limited to the above value. For example, the voltage for generating GIDL is properly changed in accordance with the material of the layer used as the transistor, the size of each layer (film thickness and gate size), and the material and size of the memory pillar.

The holes (h$^+$) generated by GIDL are supplied into the semiconductor layer 61 from the drain-side select transistor ST1.

As a result, the potential of the semiconductor layer 61 (channel region CHN of the ferroelectric transistor MC) increases approximately to the voltage Vdwk applied to the bit line BL.

As described above, in the present embodiment, the potential of the semiconductor layer 61 is increased by utilization of the GIDL generated on the drain side of the selected string MSsel.

As the potential of the semiconductor layer 61 increases, the potential difference between the selected word line WLsel and the semiconductor layer 61 becomes a negative voltage value equal to or lower than the voltage value Vwe. For example, in the present embodiment, the cell application voltage Vcell-wk (=VWLwk-Vdwk) during the weak erase operation is approximately −3V.

As a result, a weak erase voltage (detrap voltage) VWKE is applied to the selected cell MCsel.

As a result, the trapped electrons of the selected cell MCsel are emitted to the semiconductor layer 61.

During the weak erase operation performed in the present embodiment, the potential difference between the voltage Vg2b applied to the selected source-side select gate SGSsel and the voltage Vswk applied to the source line SL (n-type semiconductor layer 42) is set to a value smaller than the value that generates GIDL. For example, in the present embodiment, the potential difference between the voltage Vg2b and the voltage Vswk is approximately 0V. Thus, GIDL is not generated on the source side of the memory cell string MS.

It should be noted, however, that the potential of the select gate line SGS and the potential of the source line SL may be controlled such that GIDL is generated on the source side of the memory cell string MS.

With respect to the non-selected string MSz of the non-selected string unit SUz, the potential difference between the voltage Vunselwk applied to the non-selected drain-side select gate line SGDz and the voltage Vdwk is set to a value smaller than the voltage that generates GIDL. For example, the potential difference between the voltage Vunselwk and the voltage Vdwk is approximately 0V. In the non-selected string MSz, the potential difference between the voltage Vg2b applied to the non-selected source-side select gate SGSz and the voltage Vswk is set to a value (e.g., 0V) smaller than the voltage value that generates GIDL. Thus, GIDL is not generated in the non-selected string MSz. The potential of the semiconductor layer 61 of the non-selected string MSz is increased by the capacitive coupling between the word lines WLsel and WLz.

Therefore, electron detrap does not occur in the non-selected cell MCz of the non-selected string.

As described above, the ferroelectric memory of the present embodiment can execute a weak erase operation that utilizes GIDL.

The erase operation executed in units of block in the erase sequence may utilize GIDL.

Figure 21:
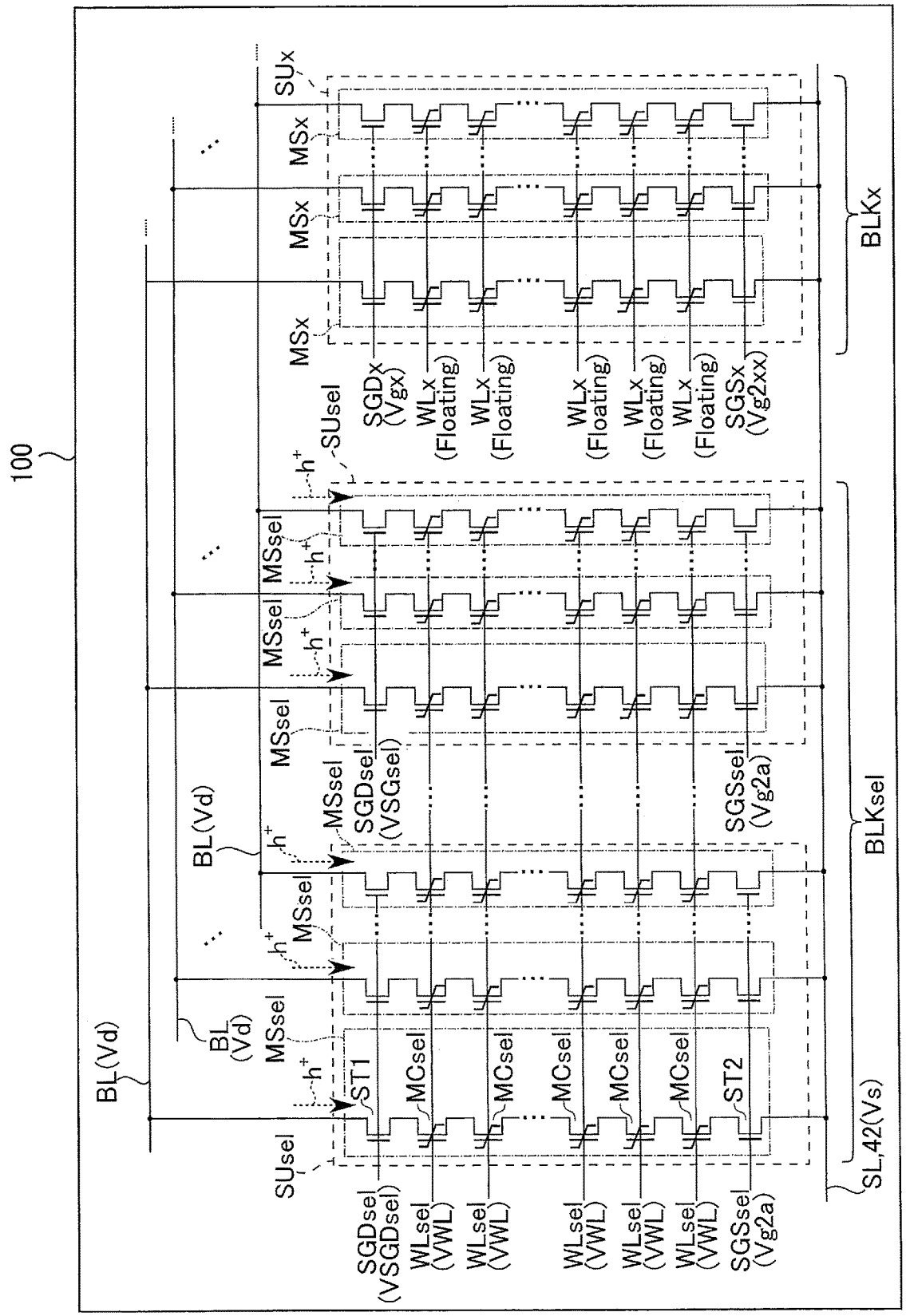

FIG. 21 is a schematic diagram for illustrating the potential of each interconnect of the memory cell array during the erase operation of the ferroelectric memory of the present embodiment.

As shown in FIG. 21, during the erase operation utilizing GIDL, the sequencer 190 controls the potential of each interconnect of a selected block BLKsel, as follows.

The sequencer 190 applies a voltage Vd (e.g., 4V) to the bit line BL and a voltage Vs (e.g., 4V) to the source line SL.

The sequencer 190 applies a voltage VSGDsel to the drain-side select gate SGDsel of each selected string unit Ssel. The sequencer 190 applies a voltage Vg2a to the source-side select gate SGSsel of each selected string unit SUsel. For example, the voltage VSGDsel is approximately 0V. For example, the voltage Vg2a is approximately 2V.

The sequencer 190 applies a selection voltage VWL (e.g., 0V) to the selected word line WLsel in the selected block BLKsel.

Due to the potential difference (VSGDsel-Vd) between the voltage Vd of the bit line BL and the voltage VSGDsel of the select gate line SGDsel, GIDL is generated at the gate edge of each drain-side select transistor ST1, as in the example shown in FIG. 20. The injection of holes caused by the GIDL raises the potential of the semiconductor layer 61 in each selected string MSsel. As a result, the erase voltage VERA is applied to the selected cell MCsel.

As a result, the memory cells MC in the selected block BLKsel are set to the erased state.

The potential of each interconnect of the non-selected block BLKx is controlled in the same manner as in the above-mentioned example shown in FIG. 10 (or FIG. 20). It should be noted, however, the voltage applied to each interconnect is properly changed as it is in the example shown FIG. 20. For example, in the non-selected block BLKx, the sequencer 190 applies a voltage Vgx (e.g., 2V) to the non-selected drain-side select gate line SGDx. The sequencer 190 applies a voltage Vg2xx (e.g., 2V) to the non-selected source-side select gate line SGSx.

As described above, the ferroelectric memory of the present embodiment can execute a weak erase operation after the program operation even when the semiconductor layer 42 to which the memory pillar 60 is coupled is an n-type semiconductor layer.

Therefore, the ferroelectric memory of the present embodiment can have substantially the same advantages as described in connection with the first embodiment.

(3) Third Embodiment

A memory device of the third embodiment will be described with reference to FIGS. 22 to 23.

Figure 22:
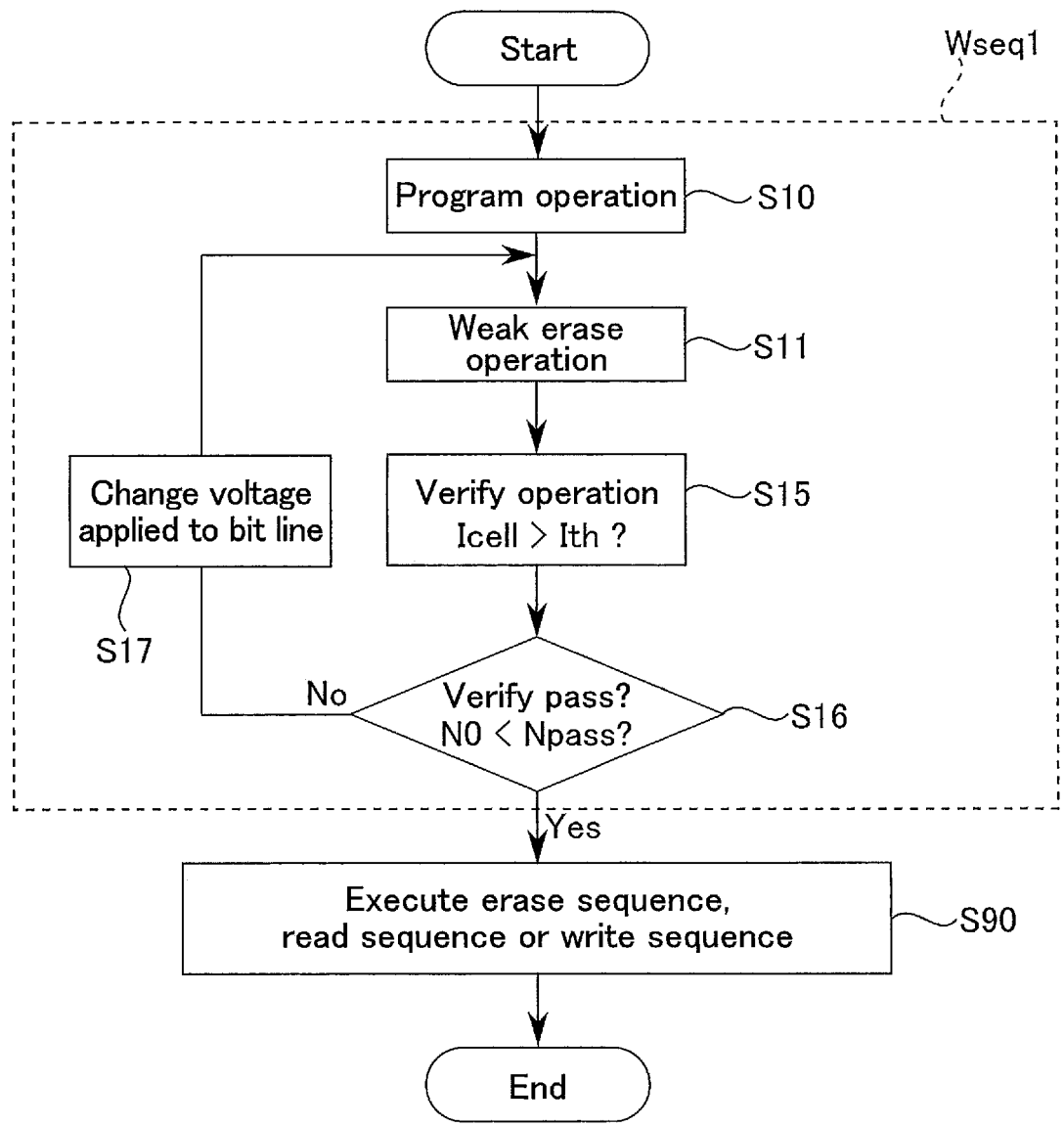
FIG. 22 is a flowchart showing an operation example of a memory device of the third embodiment.

FIG. 22 is a flowchart showing an operation example of the ferroelectric memory of the present embodiment. FIG. 23 is a schematic diagram for illustrating the operation example of the ferroelectric memory of the present embodiment.

As shown in FIG. 22, in the ferroelectric memory of the present embodiment, the write sequence Wseq1 includes a verify operation (S15).

A result of a program operation (and a weak erase operation) is verified by the verify operation (hereinafter referred to as program verify).

In the ferroelectric memory of the present embodiment, the sequencer 190 executes the write sequence Wseq1 as follows.

In the write sequence of the ferroelectric memory of the present embodiment, the sequencer 190 executes a program operation (S10).

The sequencer 190 controls the potential of each of interconnects BL, SL, SGDsel, SGSsel, SGDz, SGSz, WLz and WLsel of a selected block BLKsel, as in the example shown in FIG. 13.

As a result, predetermined data is programmed in a selected cell MCsel.

As shown in (a) of FIG. 23, a threshold voltage distribution D2z lower than the threshold voltage distribution D1a corresponding to the erased state is formed by the reversal of polarization which is caused in the ferroelectric layer 65 by the program operation.

For example, when one memory cell MC stores 1-bit data (see (a) in FIG. 8), the threshold voltage distribution D2z corresponding to a programmed state (e.g., the A state) is lower than the distribution D1a corresponding to the erased state (the Er state). With respect to the lower limit of the threshold voltage distribution corresponding to the programmed state, the limitation on the spread of the distribution is small.

For example, the voltage value of the program voltage can be set to a relatively large voltage value. The sequencer 190 properly sets the magnitude of the voltage Vp applied to the selected word line WLsel such that a relatively high program voltage is applied to the selected cell.

The sequencer 190 executes a weak erase operation (S11) after the program operation.

The sequencer 190 controls the potential of each of the interconnects BL, SL, SGDsel, SGSsel, SGDz, SGSz, WLz and WLsel of the selected block BLKsel, as in the example shown in FIG. 20 (or FIG. 15).

As a result, the trapped electrons in the selected cell MCsel are detrapped.

<S15: Program Verify>

In the present embodiment, the sequencer 190 executes a program verify (S15) after the weak erase operation.

The program verify determines whether or not predetermined write data is written in the selected cell MCsel.

The sequencer 190 controls the potential of each of the interconnects BL, SL, SGDsel, SGSsel, SGDz, SGSz, WLz and WLsel in the same manner as the above-described read operation.

The sequencer 190 applies a verify voltage Vvfy to the selected word line WLsel. The sequencer 190 detects whether or not the selected cell MCsel is turned on by the verify voltage Vvfy, based on the generation of a current flowing through the bit line BL (or a fluctuation in the potential of the bit line).

As shown in (a) of FIG. 23, the voltage level of the verify voltage Vvfy is determined in the vicinity of the high-potential-side edge of the threshold voltage distribution D2z.

For example, the sense amplifier circuit 150 detects whether or not the current value of the current Icell flowing through the corresponding bit line is equal to or higher than a determination level Ith.

When the selected cell MCsel is turned on by application of the verify voltage Vvfy, the current value of the cell current Icell is equal to or higher than the determination level Ith. In this case, the threshold voltage of the selected cell in the on state exists in the threshold voltage distribution corresponding to the write data.

Therefore, when the sense amplifier circuit 150 detects a cell current Icell equal to or more than the determination level Ith, the selected cell that causes the cell current Icell to flow to the bit line BL is determined as a verify pass.

When the selected cell MCsel is turned off by application of the verify voltage Vvfy, the current value of the cell current Icell is less than the determination level Ith. In this case, the threshold voltage of the selected cell in the off state does not exist in the threshold voltage distribution corresponding to the write data.

Therefore, when the sense amplifier circuit 150 detects a cell current Icell less than the determination level Ith, the selected cell that causes the cell current Icell to flow to the bit line BL is determined as a verify fail.

In step S16, the sequencer 190 determines whether or not the number Npass of selected cells determined as the verify pass exceeds a predetermined number (determination reference value) N0.

Based on the determination result in step S16, the program operation, the weak erase operation, and the program verify are repeatedly executed until the number Npass of selected cells determined as the verify pass exceeds the predetermined number (determination reference value) N0.

For example, when the number Npass of selected cells determined as the verify pass is equal to or less than the predetermined number N0 (No in S16), the sequencer 190 executes the weak erase operation again.

For example, the cell application voltage applied to the selected cell determined as the verify fail is changed (S17). For example, the voltage value of the voltage Vdwk applied to the bit line BL at the time of weak erase is increased by a predetermined voltage value (hereinafter referred to as a step-up voltage).

The sequencer 190 executes a weak erase operation after the program verify, for the selected cell determined as the verify fail.

For example, the sequencer 190 applies a voltage Vdwk (e.g., a voltage including the step-up voltage) to the bit line coupled to the selected cell determined as the verify fail.

As shown in (b) of FIG. 23, the trapped electrons in the ferroelectric layer 65 and the insulating layer 63 are emitted to the semiconductor layer 41 by the weak erase operation executed after the program verify.

The electron detrap shifts the threshold voltage of the selected cell determined as the verify fail to the low voltage side.

During the weak erase operation executed after program verify, the sequencer 190 applies a non-selection voltage (weak erase prohibition voltage) to the bit line coupled to the selected cell determined as the verify pass. For example, the voltage value of the non-selection voltage is set such that the potential difference between the selected word line WLsel and the semiconductor layer 61 is substantially 0V during the weak erase operation.

As a result, the threshold voltage of the selected cell determined as the verify pass is prevented from fluctuating (varying in the spontaneous polarization rate) during the weak erase operation executed after the program verify.

When the number Npass of selected cells determined as the verify pass is larger than the predetermined number N0 (Yes in S16), the sequencer 190 ends the write sequence.

After the write sequence, the sequencer 190 performs another operation (an erase sequence, a read sequence or a write sequence) (S90).

In the manner described above, the process flow of the write sequence including the verify operation shown in FIG. 22 comes to an end.

After the program verify, a program operation may be executed based on the result of the program verify. When the program operation is executed after the program verify, a verify voltage is provided on the lower voltage side of the threshold voltage distribution.

In this case, a memory cell having a threshold voltage lower than the verify voltage is determined as a verify fail. The program operation is executed for the memory cell determined as the verify fail. As a result, the threshold voltage of the memory cell determined as the verify fail is shifted to the higher voltage side.

A program verify may be performed between the program operation and the weak erase operation.

As described above, the ferroelectric memory 1 of the present embodiment executes the verify operation during the write sequence. As a result, the ferroelectric memory 1 of the present embodiment can improve the reliability of data write.

Therefore, the ferroelectric memory (memory device) of the present embodiment has improved characteristics.

(4) Modifications

Modifications of a memory device (ferroelectric memory) of an embodiment will be described with reference to FIGS. 24 to 29.

Modification 1

A modification 1 of the ferroelectric memory of the present embodiment will be described with reference to FIG. 24.

In the ferroelectric memory of the embodiment, the erase operation may be performed in units smaller than a block. For example, the erase operation is performed in units of page or subblock.

FIG. 24 shows the potential of each interconnect when the erase operation is executed in units of page in the ferroelectric memory of the present embodiment.

The example in FIG. 24 shows an erase operation executed in units of page when the memory cell array 100 has the configuration shown in FIG. 19.

As shown in FIG. 24, when the erase operation utilizing GIDL is executed in units of page, the sequencer 190 applies a voltage Vd (e.g., 4V) to a plurality of bit lines BL coupled to the cell unit CU corresponding to a selected page PGsel.

The sequencer 190 applies a voltage Vs (e.g., 4V) to the source line SL.

The sequencer 190 applies a voltage VSGsel (e.g., 0V) to the drain-side select gate line SGDsel of the selected string unit SUsel including the selected page PGsel.

The sequencer 190 applies a voltage Vunsel (e.g., 4V) to a drain-side select gate line SGDz of a non-selected string unit SUz.

The sequencer 190 applies a voltage Vg2b (e.g., 2V) to the source-side select gate line SGSsel of the selected string unit SUsel.

The sequencer 190 applies a voltage Vg2b to the source-side select gate line SGSz of the non-selected string unit SUz.

The sequencer 190 applies a voltage Vz (e.g., 2V) to non-selected word lines WLz other than a selected word line WLsel during the erase operation executed in units of page.

The sequencer 190 applies a voltage VWL (e.g., 0V) to the selected word line WLsel to which the selected page is related.

GIDL is generated by the potential difference between the bit line BL and the select gate line SGDsel. The potential of the semiconductor layer 61 is increased by the supply of holes caused by GIDL.

The potential difference between the potential of the non-selected word line WLz and the potential of the semiconductor layer 61 is higher than the erase voltage. The non-selected cell coupled to the non-selected word line maintains a polarized state according to the data it stores. Therefore, data erase does not occur for the non-selected cell MCz coupled to the non-selected word line WLz.

The potential difference between the potential of the selected word line WLsel and the potential of the semiconductor layer 61 is equal to or lower than the erase voltage Ve. As a result, the selected cell MCsel coupled to the selected word line WLsel transitions to the erased state.

Thus, data in the memory cells MCsel of the selected page PGsel are selectively erased.

As described above, the ferroelectric memory of the present modification 1 can execute the erase operation in units of page.

FIG. 25 is a schematic diagram for illustrating an example of the erase sequence performed in the ferroelectric memory of the present modification 1.

As shown in FIG. 25, even when the voltage of the semiconductor layer of the memory cell string MS is stepped up from the source line side, the erase operation can be executed in units of page.

In this case, the sequencer 190 applies a voltage VSGsel to the source-side select gate line SGSsel in the selected string unit SUsel including the selected page PGsel. As a result, holes are supplied into the semiconductor layer 61 from the source side of the memory cell string.

The sequencer 190 applies a non-selection voltage Vz to the non-selected word line WLz.

The sequencer 190 applies a selection voltage Vsel to the selected word line WLsel.

Due to the potential difference between the selected word line WL and the semiconductor layer 61, an erase voltage is applied to the selected cell MCsel of the selected page related to the selected word line.

As a result, the data in the selected cell MCsel is erased.

The erase operation may be executed in units larger than a page and smaller than a block. For example, a subblock includes a predetermined number (e.g., one or two) of string units. When the erase operation is executed in units of subblock, a predetermined number of string units SU in the block BLK are selected as targets of the erase operation. The other string units SU are set to the non-selected state.

The drain-side select gate line (or source-side select gate line) of each of the plurality of selected string units SU is set to the selected state. The potential of the semiconductor layer rises due to the supply of holes from the drain side (or from the source side) of the memory cell string. A selection voltage Vsel is applied to each of the plurality of selected word lines WLsel.

As a result, the data in the plurality of memory cells coupled to the selected word line WLsel are erased.

For example, data erase may be selectively executed for a plurality of memory cells coupled to a plurality of word lines WLsel in the state where a selection voltage Vsel is applied to two or more of the selected word lines WLsel and a non-selection voltage Vz is applied to the remaining word lines WLz.

As described above, the ferroelectric memory of the modification 1 can execute the erase operation in units smaller than a block (e.g., in units of page).

The ferroelectric memory of the modification 1 can have the same advantages as described in connection with the above-described embodiments.

Modification 2

A modification 2 of the ferroelectric memory of the present embodiment will be described with reference to FIG. 26.

The configuration of the memory cell of the ferroelectric memory of the embodiment is not limited to the example shown in FIGS. 4 and 5.

The configuration of the memory cell of the ferroelectric memory of the embodiment may have the structure shown in FIG. 26.

FIG. 26 is a top view showing a structural example of a modified memory cell.

As shown in FIG. 26, in the memory cell of the ferroelectric memory of the modification 2, two memory cells (ferroelectric transistors) MCL and MCR adjacent to each other in the Y direction in the X-Y plane are opposed to each other, with a memory pillar 60 interposed.

A ferroelectric layer 65 is continuous between the two ferroelectric transistors MCL and MCR arranged in the Y direction. An insulating layer 63 is continuous between the memory cells MCR and MCL arranged in the Y direction. A semiconductor layer 61 is continuous between two ferroelectric transistors MCL and MCR arranged in the Y direction.

A conductive layer 53L is electrically isolated from a conductive layer 53R. In this case, the conductive layer 53L and the conductive layer 53R function as different word lines WLL and WLR. For example, the conductive layers 53L and 53R have a linear structure extending in the X direction.

An insulating layer 68 is provided between the conductive layer 53L and the conductive layer 53R in the Y direction.

The insulating layer 68 electrically isolates the conductive layer 53L from the conductive layer 53R.

In FIG. 26, the memory cells (ferroelectric transistors) MCR and MCL that are arranged in the Y direction, with the semiconductor layer 61 interposed, can store data independently of each other.

The memory pillar 60 may be divided into two portions arranged in the Y direction. In this case, the semiconductor layer on the side of the ferroelectric transistor MCL is isolated from the semiconductor layer on the side of the ferroelectric transistor MCR. The ferroelectric layer of the ferroelectric transistor MCL is isolated from the ferroelectric layer of the ferroelectric transistor MCR.

The ferroelectric memory of the modification 2 can have the same advantages as described in connection with the above-described embodiments.

Modification 3

A modification 3 of the ferroelectric memory of the present embodiment will be described with reference to FIGS. 27 to 29. The configuration of the memory cell array of the ferroelectric memory of the embodiment is not limited to the configuration shown in FIGS. 3 and 19.

Figure 27:
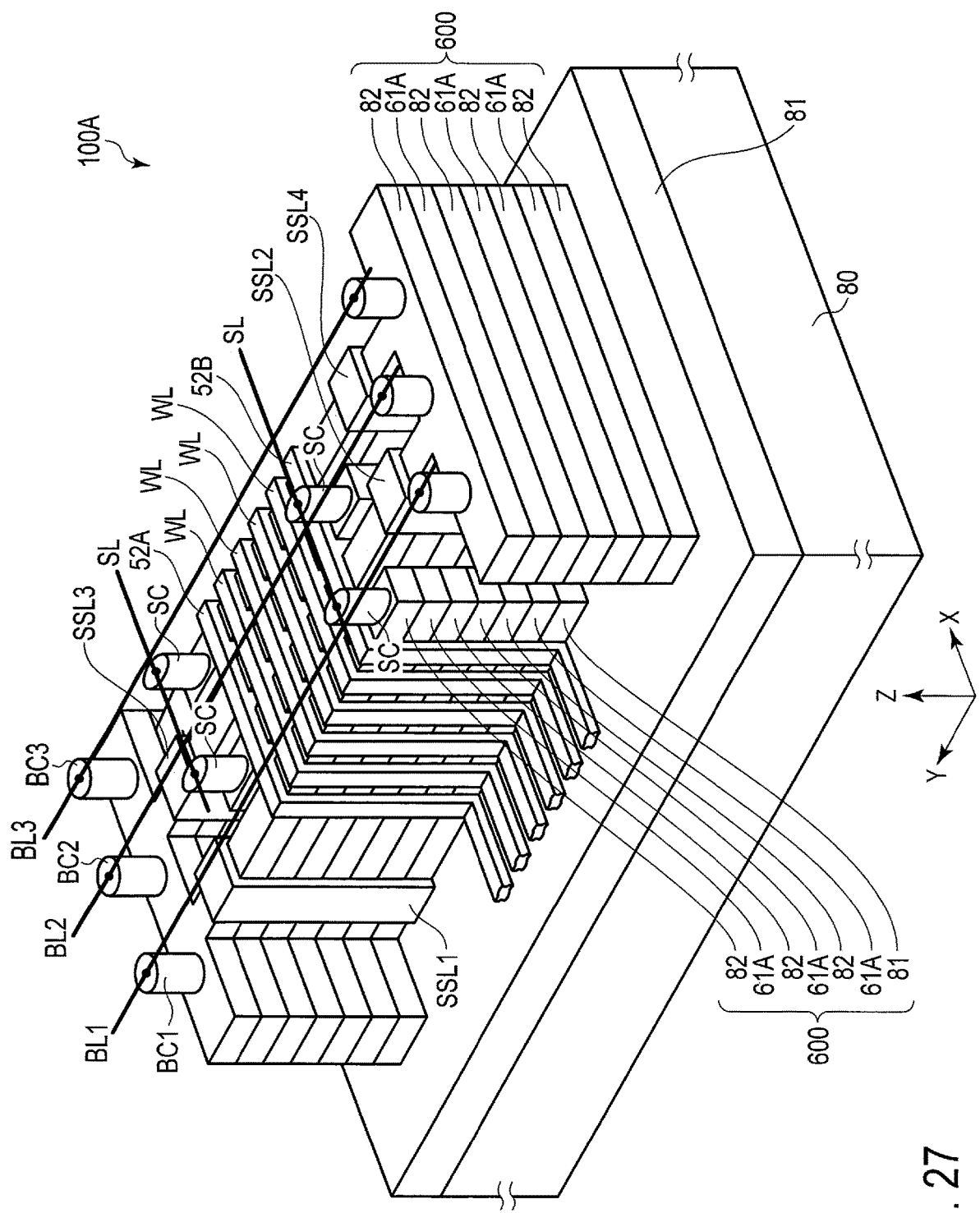
Figure 28:
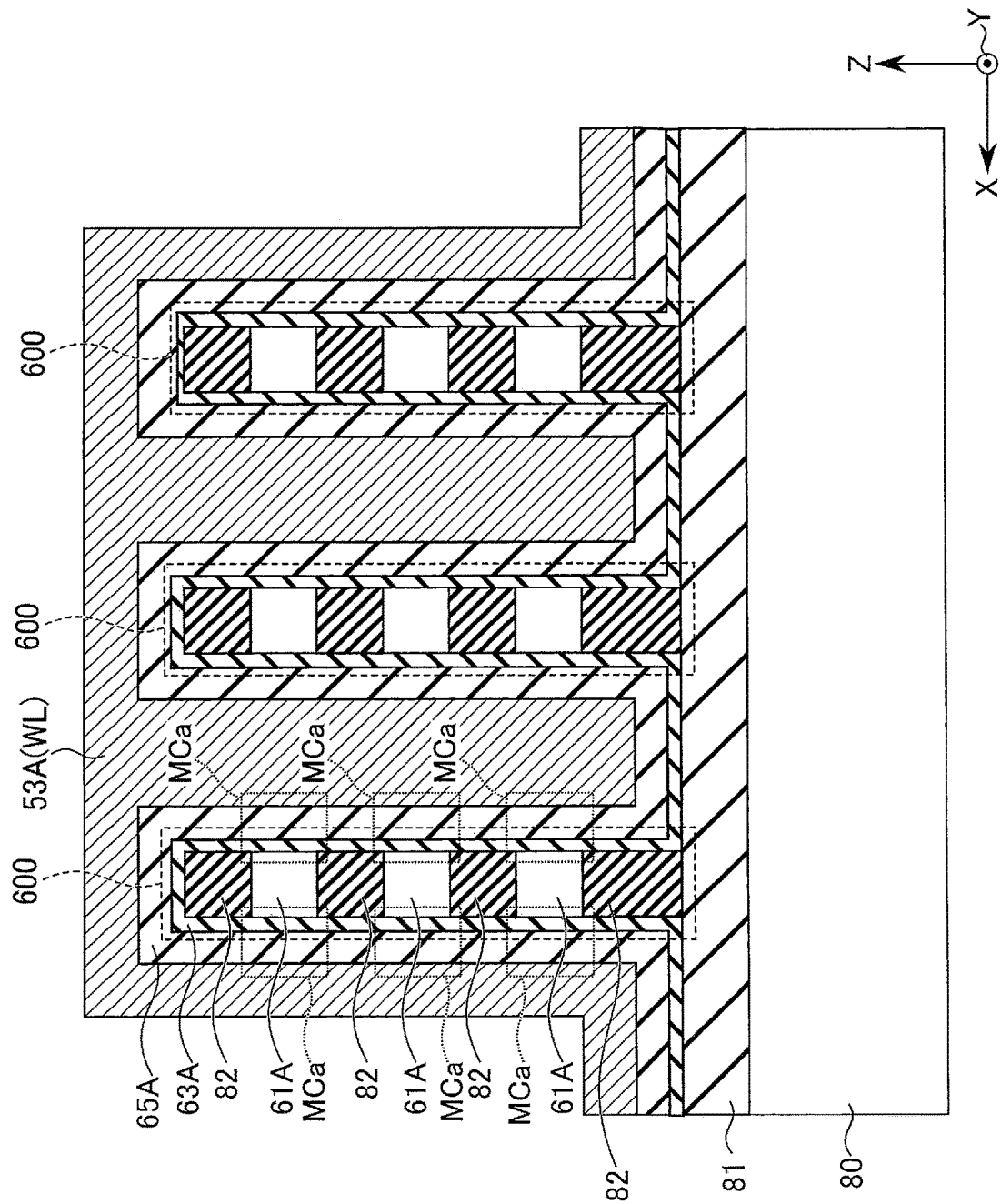
Figure 29:
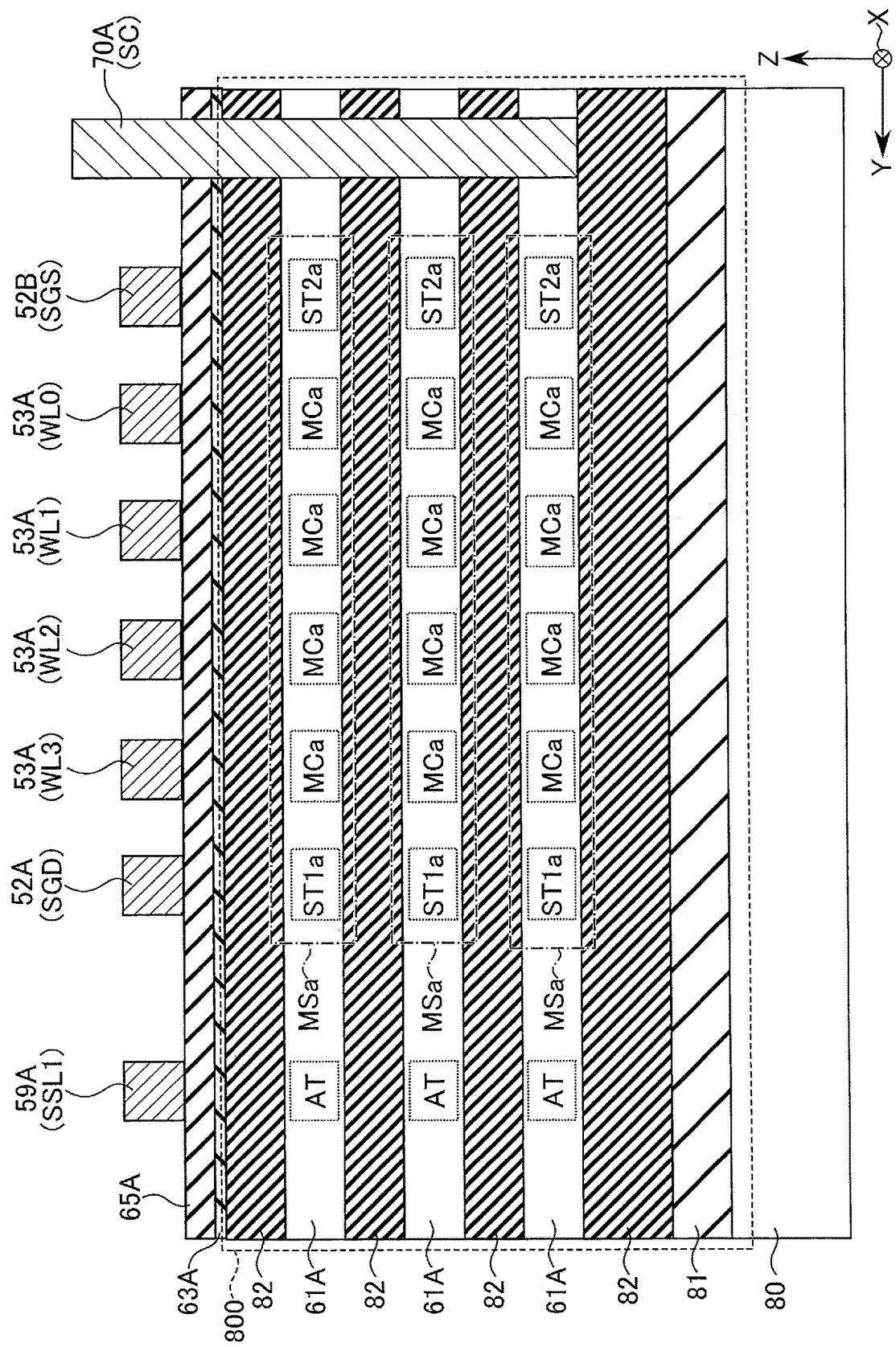

The configuration of the memory cell of the ferroelectric memory of the embodiment may be the configuration shown in FIGS. 27 to 29.

FIGS. 27 to 29 illustrate a configuration of the memory cell array of the ferroelectric memory of the modification 3. FIG. 27 is a bird's-eye view showing a configuration example of the memory cell array of the modification 3. FIG. 28 is a cross-sectional view showing the configuration example of the memory cell array of the modification 3 and taken along the X-Z plane. FIG. 29 is a cross-sectional view showing the configuration example of the memory cell array of the modification 3 and taken along the Y-Z plane.

As shown in FIGS. 27 to 29, the memory cell array 100A of the modification 3 includes a plurality of layer stacks 600 arranged in the X direction. The layer stacks 600 are arranged on the substrate 80, with an insulating layer 81 interposed.

Each layer stack 600 includes a plurality of semiconductor layers 61A stacked in the Z direction.

In each layer stack 600, the plurality of semiconductor layers 61A are arranged in the Z direction. Each semiconductor layer 61A has a prismatic structure extending in the Y direction.

Each layer stack 600 includes a plurality of insulating layers 82. A lowermost insulating layer 82 is provided between an insulating layer 81 and a lowermost semiconductor layer 61A. Each insulating layer 82 is provided between two of the semiconductor layers 61A arranged in the Z direction.

A plurality of bit line contacts BC (BC1, BC2, BC3) are provided in the contact region at one end of each layer stack 600 in the Y direction. Each bit line contact BC is coupled to the corresponding one of the semiconductor layers 61A in the layer stack 600. With this structure, one of the plurality of bit lines BL (BL1, BL2, BL3) is electrically coupled to one of the plurality of semiconductor layers 61A of one layer stack 600 via the corresponding bit line contact BC.

A source line contact 70A (SC) is provided in the contact region at the other end of the layer stack 600 in the Y direction. The source line contact 70A penetrates the plurality of semiconductor layers 61A and the insulating layers 82. The source line contact 70A is coupled to the plurality of semiconductor layers 61A of the layer stack 600. Thus, one source line SL is electrically coupled to the plurality of semiconductor layers 61A of one layer stack 600 via the source line contact 70A.

An insulating layer 63A is provided on the side face of each layer stack 600, in the X direction (the side face in the width direction of the semiconductor layer 61A) and on the upper face of the layer stack 600.

A ferroelectric layer 65A is provided on the insulating layer 63A. The ferroelectric layer 65A covers the side face and the upper face of the layer stack 600, with the insulating layer 63A interposed.

The ferroelectric layer 65A functions as a memory layer of the memory cell MCa.

A plurality of conductive layers 52A, 52B, 53A and 59A are provided on the layer stacks 600.

Each of the conductive layers 52A, 52B, 53A and 59A spans the plurality of layer stacks 600 arranged in the X direction. The conductive layers 52A, 52B, 53A and 59A are provided in the space between the layer stacks 600 arranged in the X direction.

The conductive layers 52A and 52B are used as select gate lines SGD and SGS. Of the conductive layers 52A and 52B, the layer on the side of the bit line contact BC functions as a drain-side select gate line SGD. Of the conductive layers 52A and 52B, the layer on the side of the source line contact SC functions as a source-side select gate line SGS.

Each of the plurality of conductive layers 53A is used as a word line WL.

A memory cell (ferroelectric transistor) MCa including a ferroelectric layer 65A is provided at the intersection region between the conductive layer 53A and the semiconductor layer 61A.

A drain-side select transistor ST1 is provided in the intersection region between the conductive layer 52A (or the conductive layer 52B) and the semiconductor layer 61A. A source-side select transistor ST2 is provided in the intersection region between the conductive layer 52B (52A) and the semiconductor layer 61A.

In the memory cell array 100A shown in FIGS. 27 to 29, the plurality of memory cell strings MSa are arranged in the Z direction in each layer stack 600. Each memory cell string MSa extends in the Y direction.

The memory cells MCa of the memory cell string MSa are arranged in the Y direction. A select transistor ST1a is provided at one end (on the side of the bit line contact BC) of the memory cell string MSa in the Y direction. A select transistor ST2a is provided at the other end (on the side of the source line contact SC) of the memory cell string MSa in the Y direction.

In the memory cell array 100A having the configuration shown in FIGS. 27 to 29, the region provided with the conductive layer 59A is between the region provided with the bit line contact BC and the drain-side region of the memory cell string MSa.

Each of the plurality of conductive layers 59A covers the upper face of the layer stack 600 and the side face in the X direction, with the insulating layer 63A and the ferroelectric layer 65A interposed. The conductive layer 59A is provided for each layer stack 600.

The conductive layer 59A functions as a control line SSL (SSL1, SSL2, SSL3 and SSL4) for selectively coupling one of the plurality of layer stacks 600 to the bit line BL.

A transistor AT is provided in the intersection region between the conductive layer 59A and the semiconductor layer 61A. The transistor AT controls the electrical coupling between the bit line BL and the memory cell string MSa. The transistor AT is set to the on state or the off state by controlling the potential of the control line SSL (conductive layer 59A). In the on state, the transistor AT couples the memory string MSa in the layer stack 600 to the bit line BL. In the off state, the transistor AT electrically isolates the memory string MSa in the layer stack 600 from the bit line BL.

Even when the ferroelectric memory 1 includes the memory cell array 100A having the configuration shown in FIGS. 27 to 29, the ferroelectric memory 1 of the modification 3 can execute a weak erase operation after the program operation in the write sequence.

After the weak erase operation, another operation (a verify operation, an erase sequence, a read sequence or a write sequence) is performed.

The ferroelectric memories of the modifications 1 to 3 can have the same advantages as described in connection with the embodiments.

Therefore, the memory devices of the modifications of the present embodiment can have improved characteristics.

(5) Others

The memory device of each embodiment may include the following aspects:

According to one embodiment, a memory device includes: a first conductive layer provided above a substrate in a first direction perpendicular to a surface of the substrate; a second conductive layer provided between the first conductive layer and the substrate; a third conductive layer provided between the first conductive layer and the second conductive layer; a fourth conductive layer provided between the first conductive layer and the third conductive layer; a plurality of first pillars extending in the first direction, being adjacent to the first to fourth conductive layers in a second direction parallel to the surface of the substrate, and each including a first ferroelectric layer; a plurality of first transistors provided between the first conductive layer and each of the plurality of first pillars; a plurality of second transistors provided between the second conductive layer and each of the plurality of first pillars; a plurality of first memory cells provided between the third conductive layer and each of the plurality of first pillars; a plurality of second memory cells provided between the fourth conductive layer and each of the plurality of first pillars; and a circuit configured to control a first group including the plurality of first memory cells and a second group including the plurality of second memory cells.

Each of the plurality of first memory cells includes a first ferroelectric transistor. Each of the plurality of second memory cells includes a second ferroelectric transistor.

The circuit executes a first operation in which memory cells in a selected group of the first and second groups are set to a programmed state, executes, after the first operation, a second operation in which a first voltage is applied to the memory cells in the selected group, and executes, after the second operation, a third operation in which memory cells in at least one group of the first and second groups are set to an erased state using a second voltage lower than the first voltage.

The first voltage has a negative first voltage value, and the second voltage has a negative second voltage value lower than the first voltage value.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
a first conductive layer provided above a substrate in a first direction perpendicular to a surface of the substrate;
a second conductive layer provided between the first conductive layer and the substrate;
a third conductive layer provided between the first conductive layer and the second conductive layer;
a first pillar extending in the first direction, being adjacent to the first to third conductive layers in a second direction parallel to the surface of the substrate, and including a first ferroelectric layer;
a first transistor provided between the first conductive layer and the first pillar;
a second transistor provided between the second conductive layer and the first pillar;
a first memory cell including a first ferroelectric transistor provided between the third conductive layer and the first pillar; and
a circuit configured to execute a first operation of setting the first memory cell to a programmed state, a second operation of setting the first memory cell to an erased state using a first voltage, and a third operation of applying a second voltage between the third conductive layer and the first pillar,
wherein
the first voltage has a first potential difference between the third conductive layer and the first pillar, a potential of the third conductor layer is lower than a potential of the first pillar,
the second voltage has a second potential difference between the third conductive layer and the first pillar, the second potential difference is smaller than the first potential difference, a potential of the third conductor layer is lower than a potential of the first pillar, and
the circuit executes the third operation between the first operation and the second operation.

2. The memory device according to claim 1, wherein
the circuit is configured to execute a fourth operation of determining a state of the first memory cell, and
the circuit executes the fourth operation between the third operation and the second operation.

3. The memory device according to claim 2, wherein
the circuit again executes the third operation for the first memory cell when the state of the first memory cell is determined to be different from a state corresponding to data to be stored based on a result of the fourth operation.

4. The memory device according to claim 2, wherein
the circuit reads data from the first memory cell, based on a result of the fourth operation.

5. The memory device according to claim 1, further comprising:
a p-type semiconductor layer provided below the second conductive layer in the first direction and coupled to the first pillar;
a bit line provided above the first conductive layer in the first direction and coupled to the first pillar;
a source line coupled to the p-type semiconductor layer;

a fourth conductive layer provided between the first conductive layer and the third conductive layer and being adjacent to the first pillar in the second direction; and a second memory cell including a second ferroelectric transistor provided between the fourth conductive layer and the first pillar, wherein in the third operation, the circuit applies a third voltage between the second conductive layer and the first pillar via the p-type semiconductor layer, the third voltage that sets the second transistor to an on state, applies a fourth voltage between the fourth conductive layer and the first pillar, supplies carriers from the second transistor to the first pillar, and the fourth voltage has a third potential difference between the fourth conductive layer and the first pillar, the third potential difference is smaller than the second potential difference.

6. The memory device according to claim 5, wherein a fourth potential difference between the third conductive layer and the fourth conductive layer is smaller than the second potential difference.

7. The memory device according to claim 1, further comprising:

a first semiconductor layer provided below the second conductive layer in the first direction and coupled to the first pillar;

a bit line provided above the first conductive layer in the first direction and coupled to the first pillar;

a source line coupled to the first semiconductor layer;

a fourth conductive layer provided between the first conductive layer and the third conductive layer and being adjacent to the first pillar in the second direction; and a second memory cell including a second ferroelectric transistor provided between the fourth conductive layer and the first pillar, wherein in the third operation, the circuit applies a third voltage between the first conductive layer and the first pillar via the bit line, applies a fourth voltage between the fourth conductive layer and the first pillar, supplies carriers from the first transistor to the first pillar, and the fourth voltage has a third potential difference between the fourth layer and the first pillar, the third potential difference is smaller than the second potential difference.

8. The memory device according to claim 7, wherein a fourth potential difference between the third conductive layer and the fourth conductive layer is smaller than the second potential difference.

9. The memory device according to claim 1, wherein the circuit sets a threshold voltage of the first ferroelectric transistor to a first value by the first operation, and sets the threshold voltage of the first ferroelectric transistor to a second value higher than the first value by the second operation.

10. A memory device comprising:

a first conductive layer provided above a substrate in a first direction perpendicular to a surface of the substrate;

a second conductive layer provided between the first conductive layer and the substrate;

a third conductive layer provided between the first conductive layer and the second conductive layer;

a fourth conductive layer provided between the first conductive layer and the third conductive layer;

a plurality of first pillars extending in the first direction, being adjacent to the first to fourth conductive layers in a second direction parallel to the surface of the substrate, and each including a first ferroelectric layer;

a plurality of first transistors provided between the first conductive layer and each of the plurality of first pillars;

a plurality of second transistors provided between the second conductive layer and each of the plurality of first pillars;

a plurality of first memory cells provided between the third conductive layer and each of the plurality of first pillars;

a plurality of second memory cells provided between the fourth conductive layer and each of the plurality of first pillars; and a circuit configured to execute a first operation in which memory cells belonging to one group selected from a first group and a second group are set to a programmed state, the first group including the plurality of first memory cells and the second group including the plurality of second memory cells, a second operation in which memory cells belonging to at least one group selected from the first and second groups are set to an erased state using a first voltage, and a third operation in which a second voltage is applied between each of the plurality of first pillars and one layer among the third and fourth conductive layers, the one layer corresponding to the one group selected from the first and second groups, wherein each of the plurality of first memory cells includes a first ferroelectric transistor, each of the plurality of second memory cells includes a second ferroelectric transistor, the first voltage has a first potential difference between each of the plurality of first pillars and at least one layer among the third and fourth layers, the at least one layer corresponding to the at least one group, and a potential of the at least one layer is lower than a potential of the each of the plurality of first pillars, the second voltage has a second potential difference between the each of the plurality of first pillars and the one layer, the second potential difference is smaller than the first potential difference, and a potential of the one layer is lower than a potential of the each of the plurality of first pillars, and the circuit executes, after executing the first operation for the one group, the third operation for the one group, and executes the second operation for the at least one group after the third operation.

11. The memory device according to claim 10, wherein the circuit is configured to execute a fourth operation of determining states of memory cells belonging to one group of the first group or second group, and the circuit executes the fourth operation between the third operation and the second operation.

12. The memory device according to claim 11, wherein the circuit again executes the third operation for at least one memory cell of the selected group based on a result of the fourth operation, the at least one memory cell differing from a state corresponding to data to be stored.

13. The memory device according to claim 11, wherein the circuit reads data from the memory cells based on a determination result of each state of the memory cells in the fourth operation.

14. The memory device according to claim 10, further comprising:
a p-type semiconductor layer provided below the second conductive layer in the first direction and coupled to the plurality of first pillars;
a plurality of bit lines provided above the first conductive layer in the first direction and coupled to the plurality of first pillars; and
a source line coupled to the p-type semiconductor layer, wherein
in the third operation, the circuit
applies a third voltage between the second conductive layer and each of the plurality of first pillars via the p-type semiconductor layer, the third voltage that sets the plurality of second transistors to an on state,
applies a fourth voltage between the other layer different from the one layer among the third and fourth conductive layers and the each of the plurality of first pillars,
supplies carriers from the plurality of second transistors to the plurality of first pillars, and
the fourth voltage has a third potential difference between the other layer and the each of the plurality of first pillars, and the third potential difference is smaller than the second potential difference.

15. The memory device according to claim 10, further comprising:
a first semiconductor layer provided below the second conductive layer in the first direction and coupled to the plurality of first pillars;
a plurality of bit lines provided above the first conductive layer in the first direction and coupled to the plurality of first pillars; and
a source line coupled to the first semiconductor layer; wherein
in the third operation, the circuit
applies a third voltage between the first conductive layer and each of the plurality of first pillars via each of the plurality of bit lines,
applies a fourth voltage between the other layer different from the one layer among the third and fourth conductive layer and the each of the plurality of first pillars,
supplies carriers from the first transistor to the plurality of first pillars, and
the fourth voltage has a third potential difference between the other layer and the each of the plurality of first pillars, and the third potential difference is smaller than the second potential difference.

16. The memory device according to claim 10, wherein the circuit
sets a threshold voltage of the first ferroelectric transistor to a first value by the first operation, and
sets the threshold voltage of the first ferroelectric transistor to a second value higher than the first value by the second operation.

17. A memory device comprising:
a first conductive layer provided above a substrate in a first direction perpendicular to a surface of the substrate;
a second conductive layer provided between the first conductive layer and the substrate;
a third conductive layer provided between the first conductive layer and the second conductive layer;
a fourth conductive layer provided between the first conductive layer and the third conductive layer;
a plurality of first pillars extending in the first direction, being adjacent to the first to fourth conductive layers in a second direction parallel to the surface of the substrate, and each including a first ferroelectric layer;
a plurality of first transistors provided between the first conductive layer and each of the plurality of first pillars;
a plurality of second transistors provided between the second conductive layer and each of the plurality of first pillars;
a plurality of first memory cells provided between the third conductive layer and each of the plurality of first pillars;
a plurality of second memory cells provided between the fourth conductive layer and each of the plurality of first pillars; and
a circuit configured to control a first group including the plurality of first memory cells and a second group including the plurality of second memory cells, wherein
each of the plurality of first memory cells includes a first ferroelectric transistor,
each of the plurality of second memory cells includes a second ferroelectric transistor, and
the circuit executes an erase operation in which memory cells belonging to one group selected from the first and second groups are set to a erased state.

18. The memory device according to claim 17, wherein the circuit is configured to
executes a program operation in which memory cells belonging to one group selected from the first and second groups are set to a programmed state,
executes a first operation in which a first voltage is applied between each of the plurality of first pillars and one layer among the third and fourth layers, the one layer corresponding to the one group, the first voltage being smaller than an erase voltage used for the erase operation, and
the circuit executes the first operation between the program operation and the erase operation.

19. The memory device according to claim 18, wherein
the erase voltage has a first potential difference between each of the plurality of first pillars and one layer among the third and fourth layers corresponding to the one group, a potential of the one layer is lower than a potential of each of the plurality of first pillars,
the first voltage has a second potential difference between each of the plurality of first pillar and the one layer, the second potential difference is smaller than the first potential difference, and a potential of the one layer is lower than a potential of each of the plurality of first pillars.

* * * * *